(12) United States Patent
Lim et al.

(10) Patent No.: US 11,314,452 B2
(45) Date of Patent: Apr. 26, 2022

(54) STORAGE DEVICE SUPPORTING MULTI-STREAMING AND METHOD OF CONTROLLING OPERATION OF NONVOLATILE MEMORY DEVICE

(71) Applicant: Samsung Electronics Co., Ltd., Suwon-si (KR)

(72) Inventors: Jinwoo Lim, Hwaseong-si (KR); Kyungduk Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 16/729,719

(22) Filed: Dec. 30, 2019

(65) Prior Publication Data
US 2020/0393992 A1  Dec. 17, 2020

(30) Foreign Application Priority Data
Jun. 17, 2019 (KR) .................. 10-2019-0071596

(51) Int. Cl.
*G06F 3/06* (2006.01)
*G11C 16/26* (2006.01)
*G11C 16/34* (2006.01)

(52) U.S. Cl.
CPC .......... *G06F 3/0659* (2013.01); *G06F 3/0604* (2013.01); *G06F 3/0652* (2013.01); *G06F 3/0653* (2013.01); *G06F 3/0679* (2013.01); *G11C 16/26* (2013.01); *G11C 16/3418* (2013.01)

(58) Field of Classification Search
CPC .... G06F 3/0659; G06F 3/0679; G06F 3/0652; G06F 3/0653; G06F 3/0604; G11C 2029/0409; G11C 2029/0411; G11C 29/44; G11C 29/50012; G11C 29/021; G11C 29/028; G11C 16/32; G11C 16/349; G11C 16/5642; G11C 16/26; G11C 16/0483; G11C 16/3418
See application file for complete search history.

(56) References Cited

U.S. PATENT DOCUMENTS

| | | | |
|---|---|---|---|
| 9,640,281 B1 | 5/2017 | Seo et al. | |
| 9,881,682 B1 * | 1/2018 | Tang | G06F 3/0619 |
| 10,031,689 B2 | 7/2018 | Dreyer et al. | |
| 10,095,613 B2 | 10/2018 | Jo et al. | |
| 2008/0117688 A1 * | 5/2008 | Park | G11C 16/3454 365/185.22 |
| 2008/0288814 A1 * | 11/2008 | Kitahara | G06F 11/1068 714/5.1 |

(Continued)

FOREIGN PATENT DOCUMENTS

JP  20090230475 A  10/2009

*Primary Examiner* — Reginald G Bragdon
*Assistant Examiner* — Curtis James Kortman
(74) *Attorney, Agent, or Firm* — Muir Patent Law, PLLC

(57) ABSTRACT

A method of controlling an operation of a nonvolatile memory device includes monitoring multiple data streams having different stream identifiers to determine a stream data characteristic of each of the multiple data streams, determining a plurality of operation conditions based on a plurality of operation environments, respectively, and determining one of the plurality of operation conditions as a stream operation condition of each of the multiple data streams based on the stream data characteristics of each of the multiple data streams.

20 Claims, 23 Drawing Sheets

(56) References Cited

U.S. PATENT DOCUMENTS

| | | |
|---|---|---|
| 2009/0172267 A1 | 7/2009 | Oribe et al. |
| 2015/0049547 A1* | 2/2015 | Kim .................. G11C 29/028 |
| | | 365/185.09 |
| 2015/0113207 A1 | 4/2015 | Shin |
| 2017/0177425 A1* | 6/2017 | Jei .................... G06F 11/1072 |
| 2017/0345489 A1* | 11/2017 | Zeng .................. G11C 16/10 |
| 2018/0150238 A1 | 5/2018 | Matsuyama et al. |
| 2018/0307598 A1 | 10/2018 | Fischer et al. |
| 2020/0135280 A1* | 4/2020 | Hu ..................... G11C 16/3495 |
| 2020/0185045 A1* | 6/2020 | Chen .................. G11C 29/42 |

\* cited by examiner

| BYTES | DESCRIPTION |
|---|---|
| 63:60 | CDW15 |
| 59:56 | CDW14 |
| 55:52 | CDW13 |
| 51:48 | CDW12 |
| 47:44 | CDW11 |
| 43:40 | CDW10 |
| 39:24 | PRP ENTRY |
| 23:16 | MPTR |
| 15:08 | RESERVED |
| 07:04 | NSID |
| 03:00 | CDW0 |

FIG. 15

| BYTE | B7 | B6 | B5 | B4 | B3 | B2 | B1 | B0 |
|---|---|---|---|---|---|---|---|---|
| 3 | RESERVED | | | | | | | |
| 2 | RESERVED | | | | | | | |
| 1 | STID | | | | | | | |
| 0 | INCMP | SEQR | ACCLAT | | | ACCFRQ | | |

2-bit Soft Decision Read

STORAGE DEVICE SUPPORTING MULTI-STREAMING AND METHOD OF CONTROLLING OPERATION OF NONVOLATILE MEMORY DEVICE

CROSS-REFERENCE TO RELATED APPLICATION

This U.S. non-provisional application claims priority under 35 USC § 119 to Korean Patent Application No. 10-2019-0071596, filed on Jun. 17, 2019, in the Korean Intellectual Property Office (KIPO), the disclosure of which is incorporated by reference herein in its entirety.

BACKGROUND

1. Technical Field

Example embodiments relate to semiconductor integrated circuits, and more particularly to a storage device supporting multi-streaming and a method of controlling an operation of a nonvolatile memory device.

2. Discussion of the Related Art

There are many different types of nonvolatile memory devices having constituent memory cells that operate according to different principles. For example, the memory cells of a flash memory device store data in relation to a plurality of threshold voltage distributions, while memory cells of a resistive memory device store data in accordance with a plurality of resistance distributions. In either case, each respective "distribution" represents a corresponding logic state for stored data.

Once written (or programmed) to a nonvolatile memory cell, data may be read by determining whether a selected (or target) memory cell is turned ON or OFF when a particular read voltage is applied. Thus, one or more read voltage(s) will be defined in view of the distributions intended to characterize the stored data.

During or after the programming of a memory cell, its intended distribution may become altered or distorted by a number of events or conditions including, for example charge leakage, program disturbances, read disturbances, word and/or bit line coupling, temperature change, voltage change, degeneration of the memory cell, etc. In extreme cases, an intended distribution may become so shifted and/or broadened that a "read fail" occurs.

When a read fail occurs, certain nonvolatile memory devices may execute a different type of read operation (i.e., one having a different read sequence) than the one causing the read fail. However, it is not easy to set a read sequence that properly accounts for the many events and conditions that might have altered the distributions being read. Accordingly, "read latency" (i.e., the period of time required to read stored data) may increase as changes in the current operating conditions are assessed or identified in terms of an acceptable read sequence, and performance of the nonvolatile memory device may be degraded with extension of its read latencies.

SUMMARY

Some example embodiments may provide a storage device supporting multi-streaming efficiently and a method of controlling an operation of a nonvolatile memory device.

According to example embodiments, a method of controlling an operation of a nonvolatile memory device includes monitoring multiple data streams having different stream identifiers to determine a stream data characteristic of each of the multiple data streams, determining a plurality of operation conditions based on a plurality of operation environments, respectively, and determining one of the plurality of operation conditions as a stream operation condition of each of the multiple data streams based on the stream data characteristics of each of the multiple data streams.

According to example embodiments, a method of controlling an operation of a nonvolatile memory device that exchanges multiple data streams with a storage controller, each of the multiple data streams being identified with a corresponding one of a plurality of stream identifiers includes monitoring at least one of data retention characteristic and a read disturb characteristic of each of the multiple data streams, determining a plurality of read sequences based on a plurality of operation environments, respectively, the plurality of read sequences having different combinations of a plurality of read operations, the plurality of read operations having different read voltage sets or different read times, and determining at least one of a retention read sequence or a disturb read sequence among the plurality of read sequences as a stream operation condition of each of the multiple data streams. In the retention read sequence, a read operation having a read voltage set corresponding to a case that the data retention characteristics are degenerated is performed first. In the read disturb sequence, a read operation having a read voltage set corresponding to a case that the read disturb characteristics are degenerated is performed first.

According to example embodiments, a storage system processing multiple data streams, each of the multiple data streams being identified with a corresponding one of a plurality of stream identifiers includes a nonvolatile memory device comprising a memory cell array in which a plurality of nonvolatile memory cells are arranged and a controller configured to store a plurality of operation conditions respectively corresponding to a plurality of operation environments, configured to monitor a stream data characteristic with respect to each of the plurality of the multiple data streams, and configured to determine a stream operation condition corresponding to each of the multiple data streams among the plurality of operation conditions based on the stream data characteristic of each of the multiple data streams.

The storage device supporting multi-streaming and the method of controlling an operation of a nonvolatile memory device according to example embodiments may enhance performance of the nonvolatile memory device and the storage device including the nonvolatile memory device by setting the stream operation conditions suitable for the stream data characteristics.

BRIEF DESCRIPTION OF THE DRAWINGS

Example embodiments of the present disclosure will be more clearly understood from the following detailed description taken in conjunction with the accompanying drawings.

FIG. 15 is a diagram illustrating an example format of a lowest double word included in the command of FIG. 14.

DETAILED DESCRIPTION OF THE EMBODIMENTS

Figure 1:
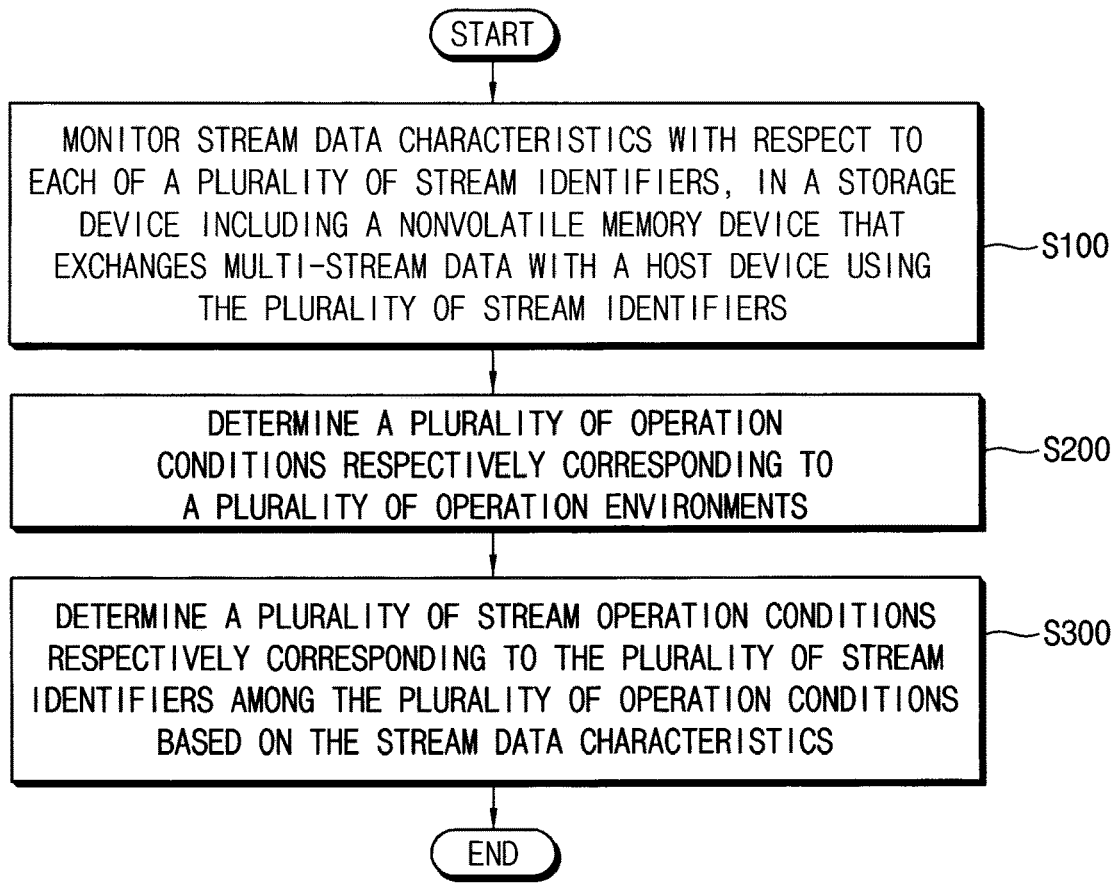
FIG. 1 is a flow chart illustrating a method of controlling an operation of a nonvolatile memory device according to example embodiments.

Various example embodiments will be described more fully hereinafter with reference to the accompanying drawings, in which some example embodiments are shown. In the drawings, like numerals refer to like elements. The repeated descriptions may be omitted.

FIG. 1 is a flow chart illustrating a method of controlling an operation of a nonvolatile memory device according to example embodiments.

Referring to FIG. 1, in a storage device including a nonvolatile memory device that exchanges multi-stream data (or multiple data streams) with a storage controller using a plurality of stream identifiers, stream data characteristics are monitored with respect to each of the plurality of stream identifiers (S100). The stream data characteristics may be monitored continually and in real-time. In some example embodiments, the stream data characteristics to be monitored may include data retention characteristics indicating a duration for which data stored in memory cells are maintained and read disturb characteristics indicating distortions of states of memory cells due to repeated read operations.

A plurality of operation conditions respectively corresponding to a plurality of operation environments are determined (S200). The operation environments may be changed and determined according to various factors affecting the operation of the nonvolatile memory device. For example, the operation environments may be determined according to the factors such as an operation temperature, a degeneration degree of memory cells, a user scenario, characteristics of data used by application programs and the like. When at least one of the factors changes, the operation environments may change. The plurality of operation conditions may include a plurality of read sequences, a plurality of program conditions or a plurality of erase operation conditions, as will be described below.

A plurality of stream operation conditions respectively corresponding to the plurality of stream identifiers are determined among the plurality of operation conditions based on the stream data characteristics (S300). The stream operation conditions may be optimized for the corresponding stream data characteristics.

As such, performance of the nonvolatile memory device and the storage device including the nonvolatile memory device may be enhanced by setting the stream operation conditions suitable for the stream data characteristics.

Figure 2:
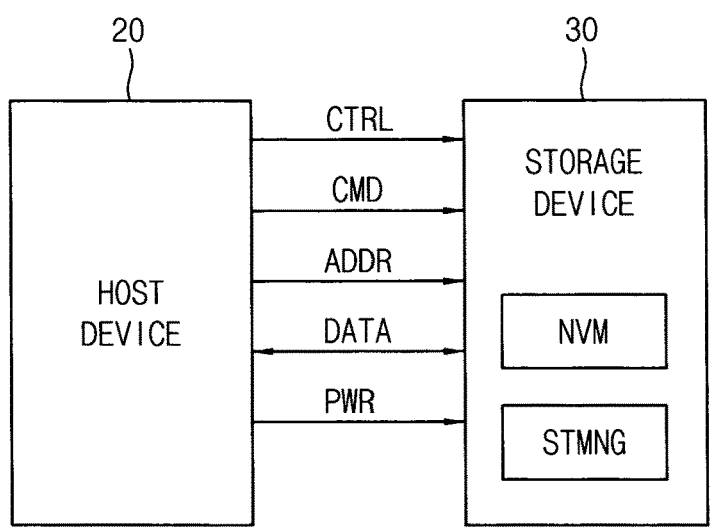
FIG. 2 is a block diagram illustrating a storage system according to example embodiments.

FIG. 2 is a block diagram illustrating a storage system according to example embodiments.

Referring to FIG. 2, a storage system 10 may include a storage controller 20 and a storage device 30. The storage device 30 may include at least one nonvolatile memory device NVM. The storage device 30 may include a flash memory or data storage media based on the flash memory such as a memory card and a universal serial bus (USB) memory. In an example embodiment, the storage system 10 may include a solid state drive (SSD).

The storage device 30 may perform a read operation, an erase operation, and a program operation or a write operation under control of the storage controller 20. The storage device 30 may receive a command CMD, an address ADDR and data DATA through input/output lines from the storage controller 20 for performing such operations. In addition, the storage device 30 may receive a control signal CTRL through a control line from the storage controller 20 and receive a power PWR through a power line from the storage controller 20.

The storage device 30 may include a stream manager STMNG according to example embodiments. As described with reference to FIG. 1, the stream manager STMNG may monitor the stream data characteristics with respect to each of the plurality of stream identifiers and determine the plurality of stream operation conditions respectively corresponding to the plurality of stream identifiers among the plurality of operation conditions based on the monitored stream data characteristics.

Figure 3:
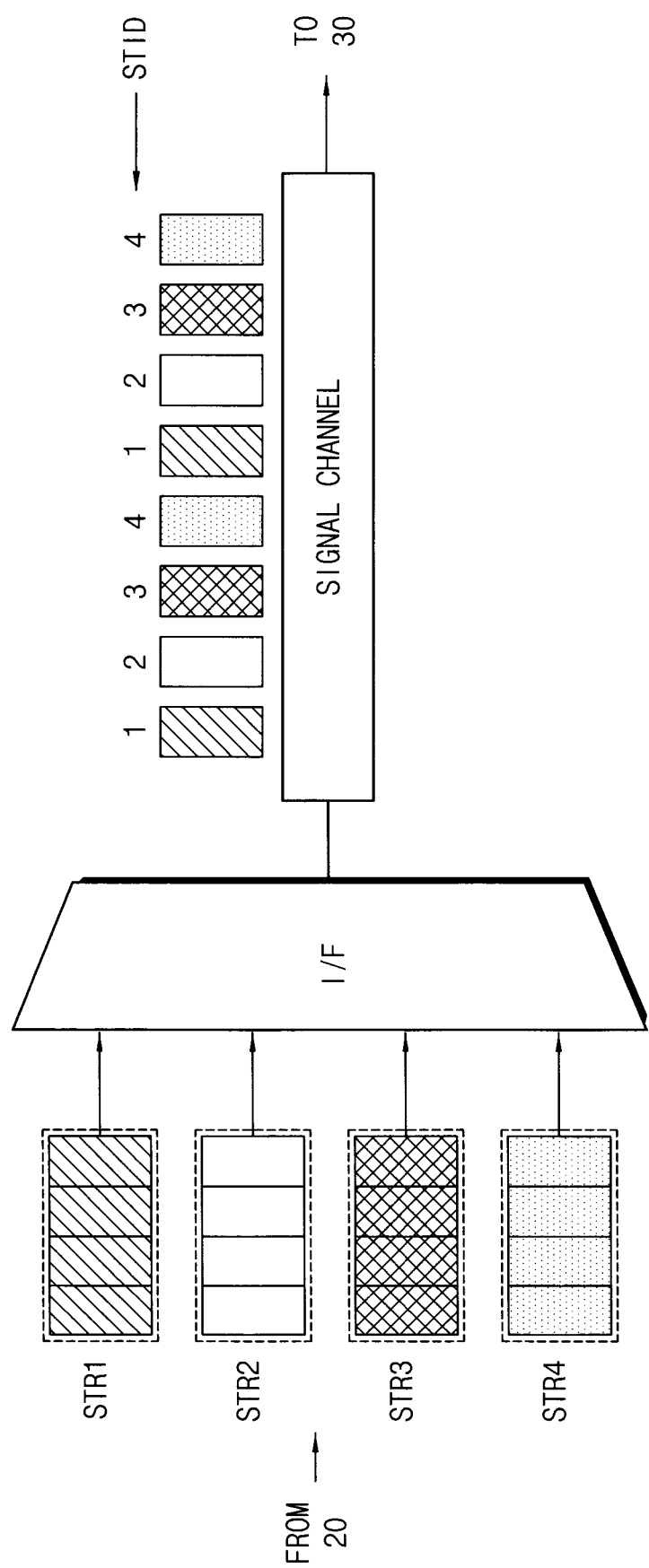
FIG. 3 is a diagram illustrating an example transfer of multi-stream data to be requested by a host device to be written to a storage device.

FIG. 3 is a diagram illustrating an example transfer of multi-stream data to be requested by a storage controller to be written to a storage device.

Referring to FIG. 3, since a signal channel exists between a storage controller 20 and a storage device 30, it is difficult to transfer multi-stream data (or multiple data streams) to the storage device 30 at the same time. A write request to the storage device 30 may be performed by a unit of a plural segments, for example, which may form one stream. In the event that a plurality of stream data are write-requested, a write command of each segment may include a multi-stream index or a stream identifier STID. The present invention is not limited thereto. In an example embodiment, a write request to the storage device 30 may be performed by a unit of a plurality of blocks or pages, which may form one stream.

As shown in FIG. 3, it may be assumed that a host (not shown) runs application programs in multithreading, the application programs generating write requests associated with four stream data (or data streams) driven by the storage controller 20 connected to the host. Each of a plurality of stream identifiers STID (e.g., STID=1, 2, 3 or 4) may be allocated to each of a plurality of stream data (or multiple data streams) STR1, STR2, STR3 and STR4. The storage device 30 may store the write-requested data based on the plurality of stream identifiers STID. For example, the storage device 30 may store the data of the same stream identifier STID in the same memory region (e.g., in the same memory block corresponding to a unit of an erase operation). Accordingly, efficiency of operations such as a garbage collection, a sequential read or a sequential write may be enhanced.

Figure 4:
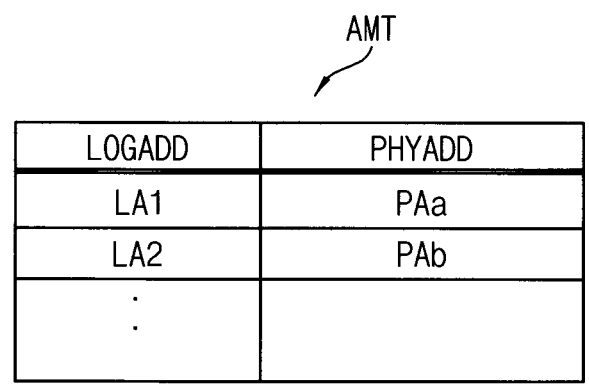
FIG. 4 is a diagram illustrating an address mapping table of a flash translation layer.

FIG. 4 is a diagram illustrating an address mapping table of a flash translation layer.

Referring to FIG. 4, the storage controller 20 may operate based on an address mapping table AMT including mapping information between a logical address LOGADD of the host device and a physical address PHYADD of the nonvolatile memory device in the storage device 30. For example, a logical address LA1 is mapped to a physical address PAa and a logical address LA2 is mapped to a physical address PAb according to the mapping information of the address mapping table AMT. The flash translation layer (FTL), as firmware of the storage controller 20, may use the address mapping table AMT to determine a physical address of the nonvolatile memory device corresponding to a logical address requested by the host device, and vice versa.

Figure 5:
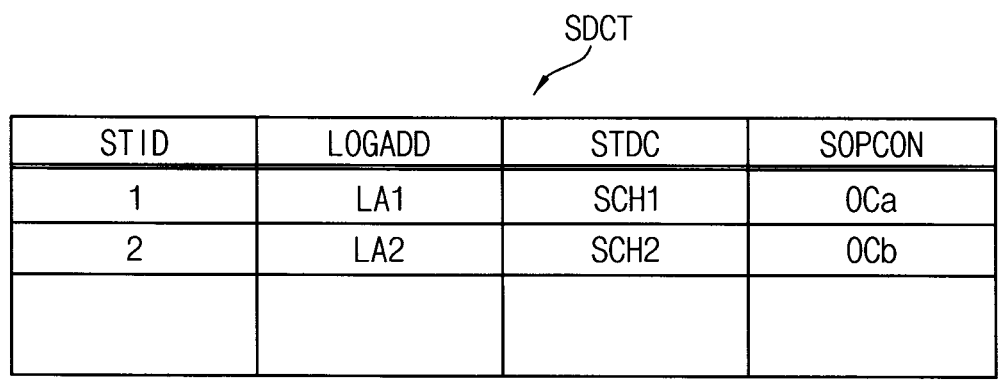
FIG. 5 is a diagram illustrating an example embodiment of a stream control table of a stream manager included in a nonvolatile memory device according to example embodiments.

FIG. 5 is a diagram illustrating an example embodiment of a stream control table of a stream manager included in a storage device according to example embodiments.

Referring to FIG. 5, a stream control table SDCT may include mapping information between stream identifiers STID, logical addresses LOGADD, stream data characteristics STDC and stream operation conditions SOPCON. The stream manager STMNG in FIG. 2 may monitor the stream data characteristics STDC (e.g., STDC=SCH1 or SCH2) with respect to each of a plurality of stream identifiers STID (e.g., STID=1 or 2), and determine a plurality of stream operation conditions SOPCON (e.g., SOPCON=OCa or OCb) respectively corresponding to the plurality of stream identifiers STID among the plurality of operation conditions based on the stream data characteristics STDC.

Figure 6:
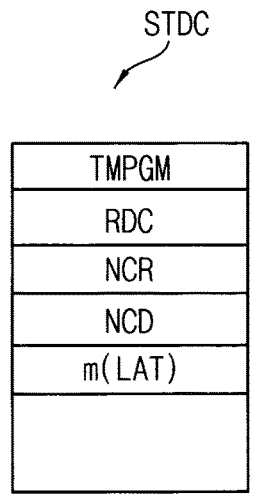
FIG. 6 is a diagram illustrating example embodiments of stream data characteristics included in the stream control table of FIG. 5.

FIG. 6 is a diagram illustrating example embodiments of stream data characteristics included in the stream control table of FIG. 5.

Referring to FIG. 6, the stream data characteristic STDC monitored by the stream manager STMNG may include a program time point TMPGM when data are programmed in the nonvolatile memory device, a read count RDC, a number NCR of memory cells in a retention-weak state, a number NCD of memory cells in a read disturb-weak state, a plurality of average read latencies m(LAT) respectively corresponding to a plurality of read sequences.

In some example embodiments, the stream manager STMNG may determine the data retention characteristic with respect to each of the multiple streams which is identified with a corresponding one of the plurality of stream identifiers, by monitoring a program-read interval time between the program time point TMPGM when data are written in the nonvolatile memory device and a read time point when the data are read from the nonvolatile memory device.

In some example embodiments, the stream manager STMNG may determine the data retention characteristic with respect to each of the multiple streams that is identified with a corresponding one of the plurality of stream identifiers, by monitoring the number NCR of memory cells in a retention-weak state among a plurality of memory cells of the nonvolatile memory device in a plurality of states, where the retention-weak state corresponds to at least one of the plurality of states.

In some example embodiments, the stream manager STMNG may determine the read disturb characteristics with respect to each of the plurality of stream identifiers, by monitoring the read count RDC indicating a number of times that data is read since the data are written in the nonvolatile memory device.

In some example embodiments, the stream manager STMNG may determine the read disturb characteristic of each of the multiple data streams which is identified with a corresponding one of the plurality of stream identifiers, by monitoring the number NCD of memory cells in a read disturb-weak state among a plurality of memory cells of the nonvolatile memory device in a plurality of states, where the read disturb-weak state corresponds to at least one of the plurality of states.

In some example embodiments, the stream manager STMNG may monitor the plurality of average read latencies m(LAT) respectively corresponding to a plurality of read sequences with respect to each of the plurality of stream identifiers, and may select a main read sequence as the stream operation condition among the plurality of read sequences. The main read sequence corresponds to the read sequence having a minimum average read latency among the plurality of average read latencies m(LAT).

The factors illustrated in FIG. 6 are non-limiting examples, and example embodiments are not limited thereto. For example, the stream data characteristic STDC may include a program temperature at a time when data are written in the nonvolatile memory device. In this case, the stream manager STMNG may determine suitable stream operation conditions by monitoring a difference between the program temperature and a read temperature at a time when the data are read from the nonvolatile memory device.

Figure 7:
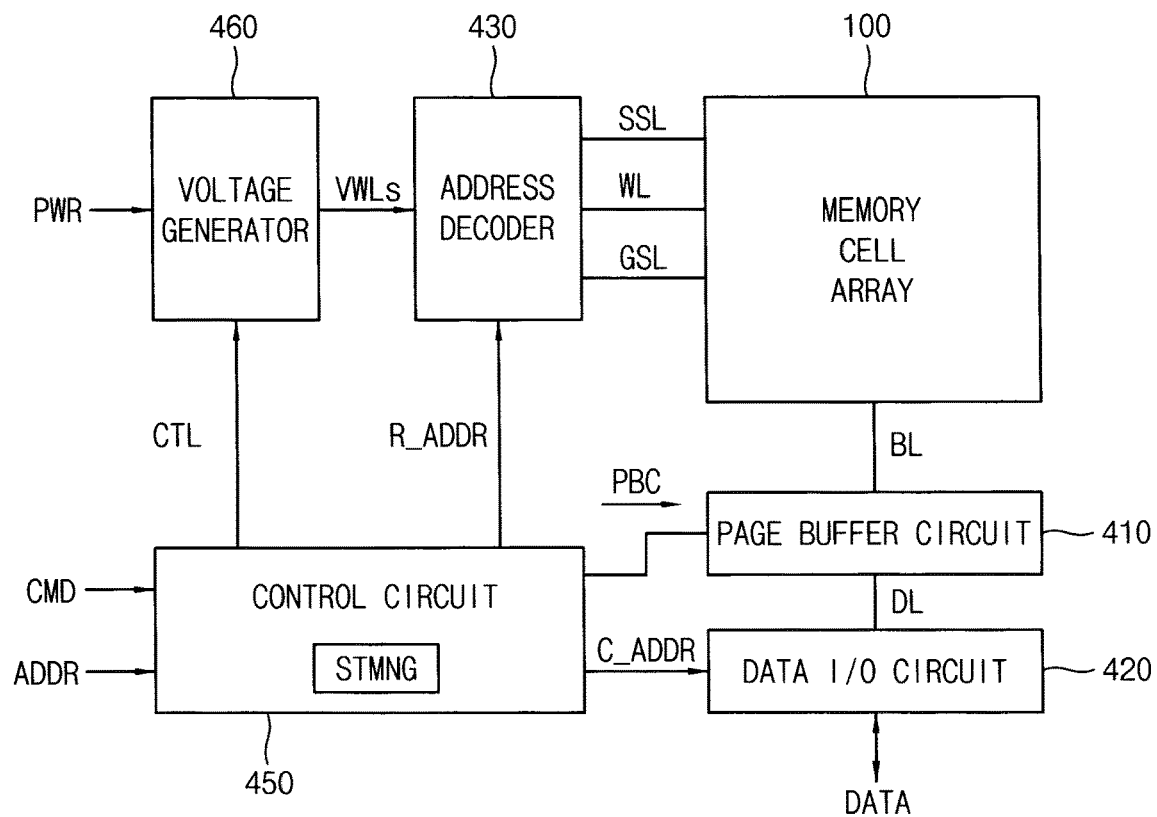
FIG. 7 is a block diagram illustrating a nonvolatile memory device according to example embodiments.

FIG. 7 is a block diagram illustrating a nonvolatile memory device according to example embodiments.

Referring to FIG. 7, the storage device 30 includes a nonvolatile memory device that includes a memory cell array 100, a page buffer circuit 410, a data input/output circuit 420, an address decoder 430, a control circuit 450 and a voltage generator 460.

The memory cell array 100 is coupled to the address decoder 430 through a plurality of string selection lines SSL, a plurality of wordlines WL, and a plurality of ground selection lines GSL. In addition, the memory cell array 100 is coupled to the page buffer circuit 410 through a plurality of bitlines BL.

The memory cell array 100 may include a plurality of memory cells coupled to the plurality of wordlines WL and the plurality of bitlines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 receives a command (signal) CMD and an address (signal) ADDR from the storage controller 20, which may also be referred to a memory controller. The control circuit 450 may control erase, programming and read operations of the nonvolatile memory device 30 based on the command signal CMD and the address signal ADDR. For example, the control circuit 450 may generate control signals CTL, which are used for controlling the voltage generator 460, generate a page buffer control signal PBC for controlling the page buffer circuit 410, based on the command signal CMD, and generate a row address R_ADDR and a column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of wordlines WL, and the plurality of ground selection lines GSL. During the program operation or the read operation, the address decoder 430 may determine one of the plurality of wordlines WL as a selected wordline and determine the rest of the plurality of wordlines WL, except for the selected wordline, as unselected wordlines, based on the row address R_ADDR. In addition, during the program operation or the read operation, the address decoder 430 may determine one of the plurality of string selection lines SSL as a selected string selection line, and determine the rest of the plurality of string selection lines SSL except for the selected string selection line as unselected string selection lines based on the row address R_ADDR.

The voltage generator 460 may generate wordline voltages VWL, which may be needed for the operation of the memory cell array 100 of the nonvolatile memory device 30, based on the control signals CTL. The voltage generator 460 may receive the power PWR from the storage controller 20. The wordline voltages VWL may be applied to the plurality of wordlines WL through the address decoder 430.

The page buffer circuit 410 may be coupled to the memory cell array 100 through the plurality of bitlines BL. The page buffer circuit 410 may include a plurality of buffers. The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 410 may receive program data DATA received from the host device via the storage controller 20, and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the host device, via the storage controller 20, based on the column address C_ADDR received from the control circuit 450.

The control circuit 450 may include a stream manager STMNG according to example embodiments. The stream manager STMNG may monitor the stream data characteristic with respect to each of the plurality of stream identifiers and determine the plurality of stream operation conditions respectively corresponding to the plurality of stream identifiers among the plurality of operation conditions based on the monitored stream data characteristics.

Figure 8:
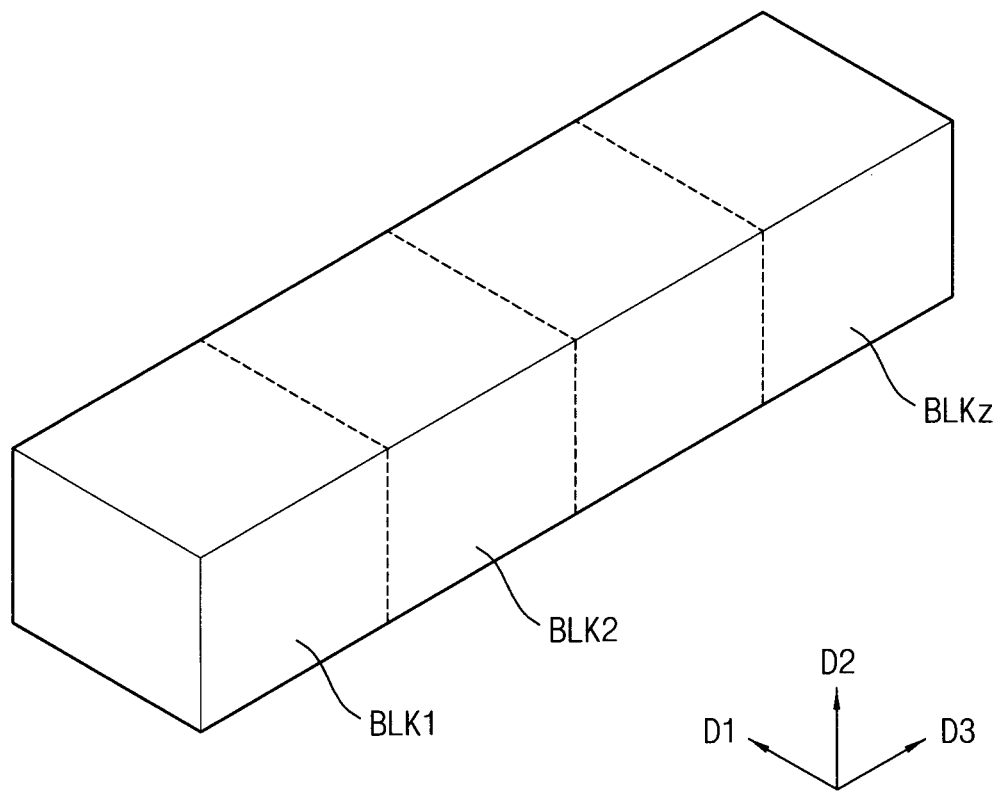
FIG. 8 is a block diagram illustrating an example embodiment of a memory cell array included in a nonvolatile memory device according to example embodiments.
Figure 9:
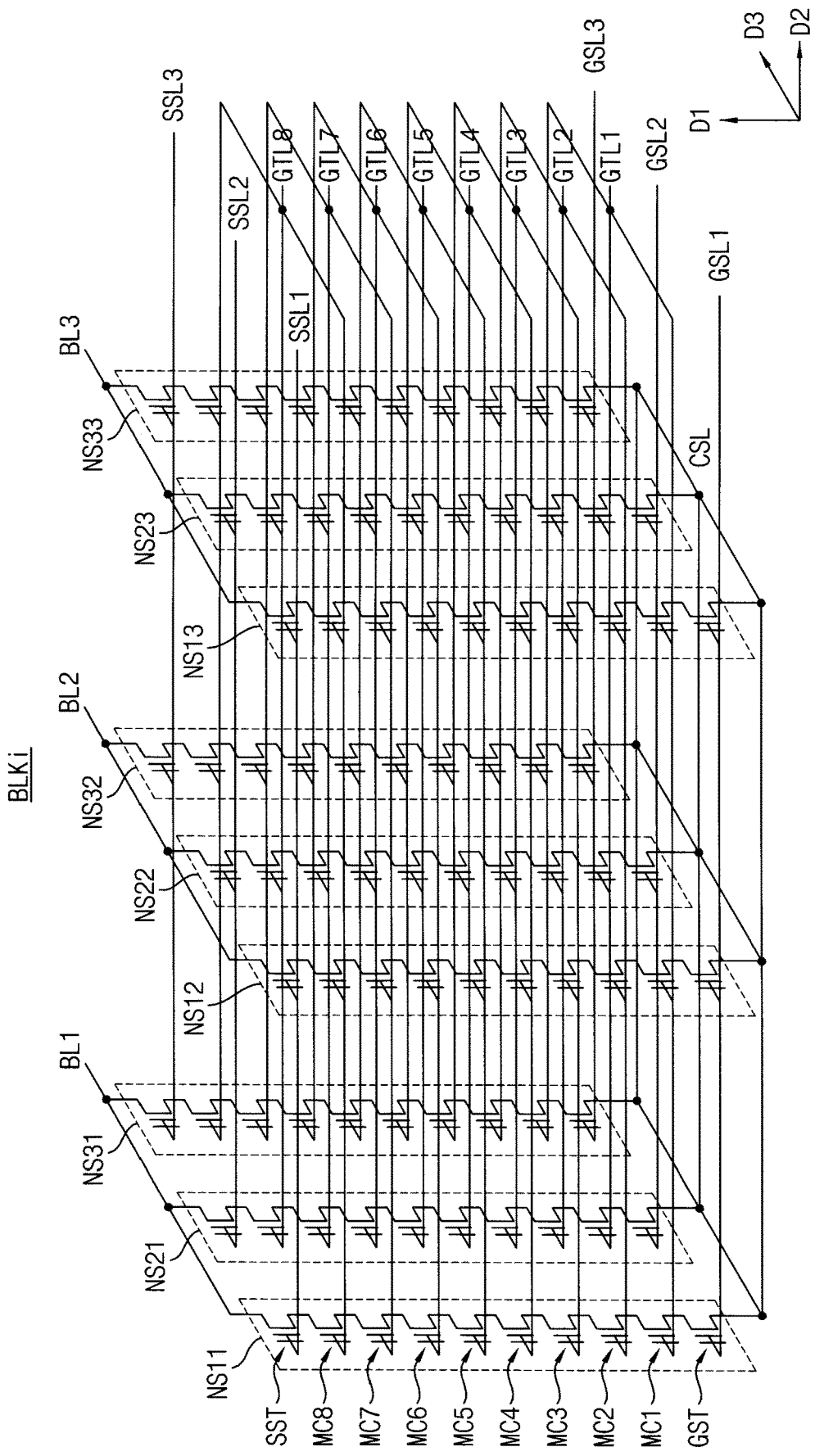
FIG. 9 is a circuit diagram illustrating an equivalent circuit of a memory block in FIG. 8.

FIG. 8 is a block diagram illustrating an example embodiment of a memory cell array included in a nonvolatile memory device according to example embodiments, and FIG. 9 is a circuit diagram illustrating an equivalent circuit of a memory block in FIG. 8.

As illustrated in FIG. 8, the memory cell array 100 includes a plurality of memory blocks BLK1 to BLKz. The memory blocks BLK1 to BLKz are selected by the address decoder 430 in FIG. 7. For example, the address decoder 430 may select a particular memory block BLK corresponding to a block address among the memory blocks BLK1 to BLKz.

The memory block BLKi of FIG. 9 may be formed on a substrate in a three-dimensional structure (or a vertical structure). For example, a plurality of NAND strings or cell strings included in the memory block BLKi may be formed in a first direction D1 perpendicular to a second direction D2 and a third direction D3, that is, perpendicular to the upper surface of the substrate.

Referring to FIG. 9, the memory block BLKi includes NAND strings NS11 to NS33 coupled between bitlines BL1, BL2 and BL3 and a common source line CSL. Each of the NAND strings NS11 to NS33 includes a string selection transistor SST, a plurality of memory cells MC1 to MC8, and a ground selection transistor GST. In FIG. 9, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to the plurality of gate lines GTL1 to GTL8, respectively. The gate lines GTL1 to GTL8 may be wordlines and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL1, BL2 and BL3), and each ground selection transistor GST may be connected to the common source line CSL.

Wordlines (e.g., WL1) having the same height (i.e., level) may be commonly connected, and the ground selection lines GSL1 to GSL3 and the string selection lines SSL1 to SSL3 may be separated. In FIG. 9, the memory block BLKi is illustrated to be coupled to eight gate lines GTL1 to GTL8 and three bitlines BL1 to BL3. However, example embodiments are not limited thereto.

Figure 10:
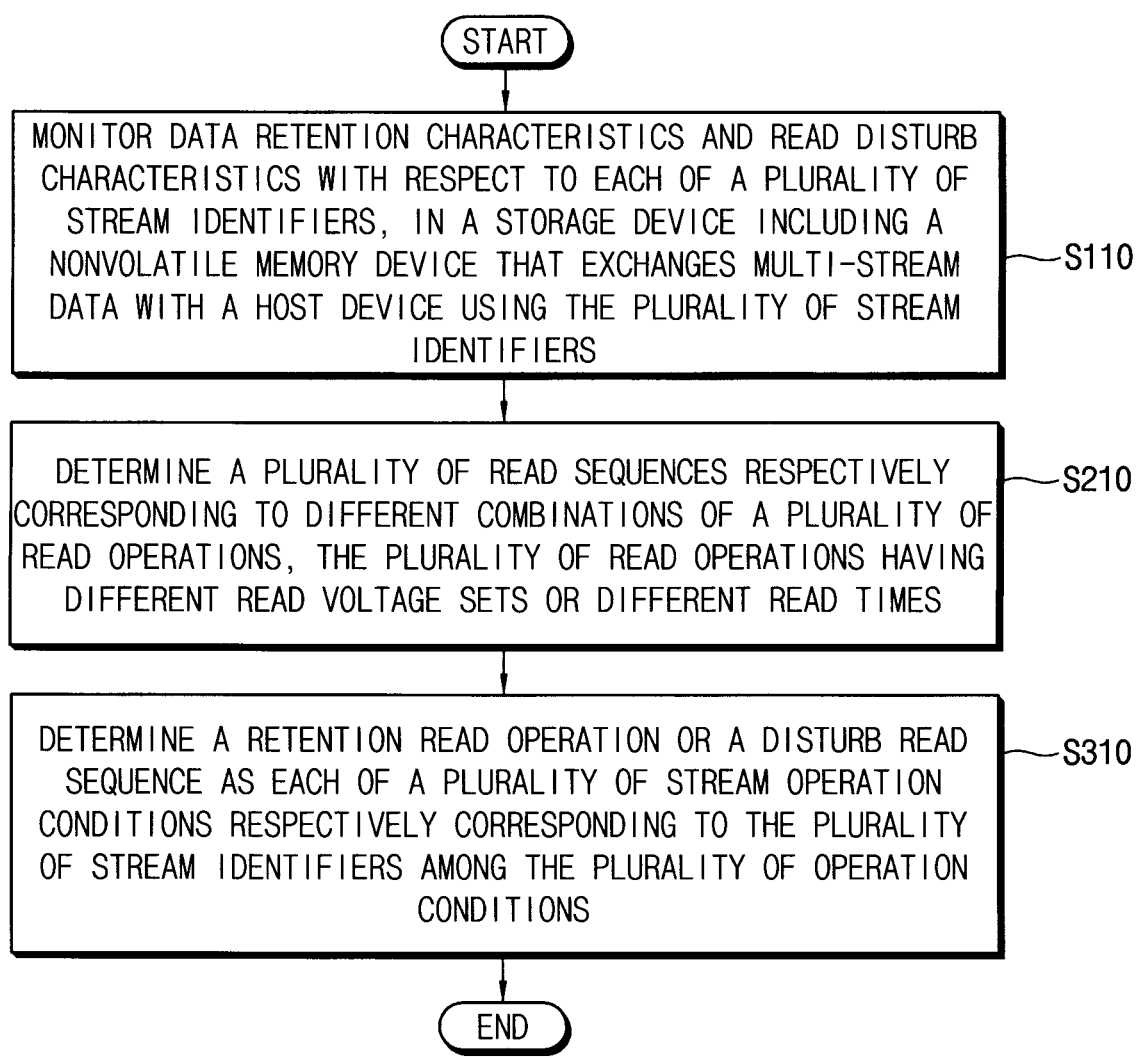
FIG. 10 is a flow chart illustrating a method of controlling an operation of a nonvolatile memory device according to example embodiments.

FIG. 10 is a flow chart illustrating a method of controlling an operation of a nonvolatile memory device according to example embodiments.

Referring to FIG. 10, in a storage device including a nonvolatile memory device that exchanges multi-stream data with a storage controller using the plurality of stream identifiers, data retention characteristic and read disturb characteristic may be monitored with respect to each of a plurality of stream identifiers (S110). A plurality of read sequences respectively corresponding to different combinations of a plurality of read operations may be determined where the plurality of read operations have different read voltage sets or different read times (S210). A retention read sequence or a disturb read sequence may be determined as each of a plurality of stream operation conditions respectively corresponding to the plurality of stream identifiers among the plurality of operation conditions (S310). The read operation having the read voltage set corresponding to a case that the data retention characteristics are degenerated may be performed first in accordance with the retention read sequence. The read operation having the read voltage set corresponding to a case that the read disturb characteristics are degenerated may be performed first in accordance with the retention read sequence.

Hereinafter, example embodiments of the method of FIG. 10 will be further described below with reference to FIGS. 11 through 31.

Figure 11:
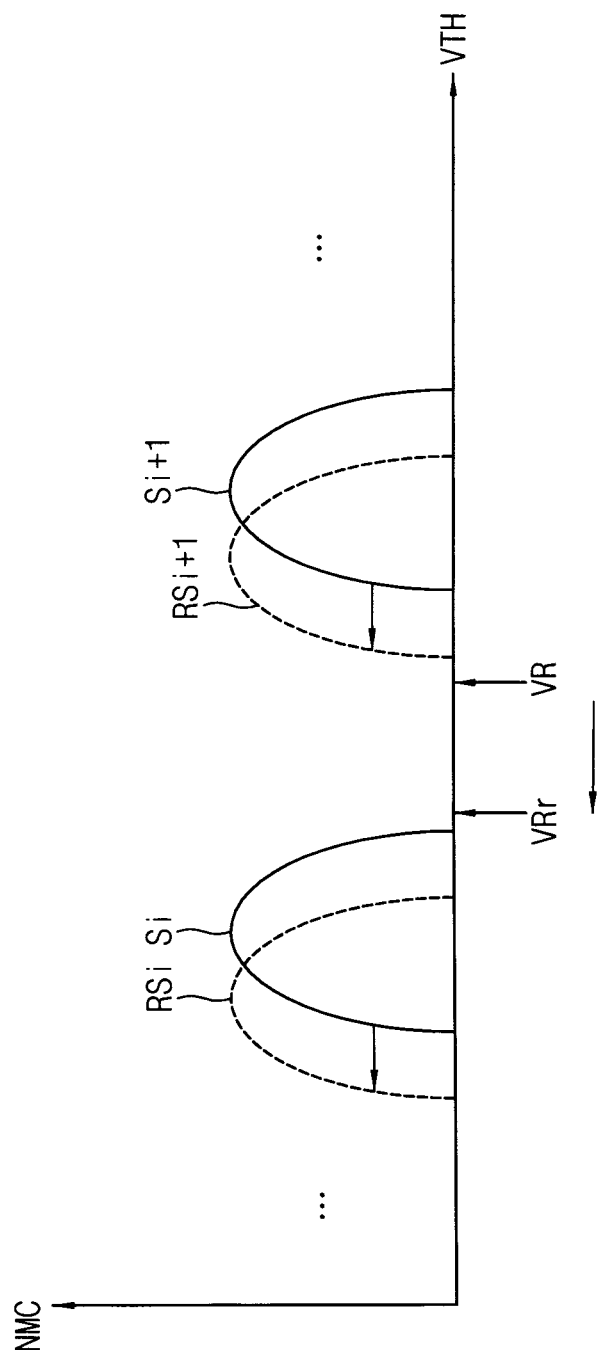
FIGS. 11 and 12 are diagrams for describing changes of threshold voltage distribution of memory cells.
Figure 12:
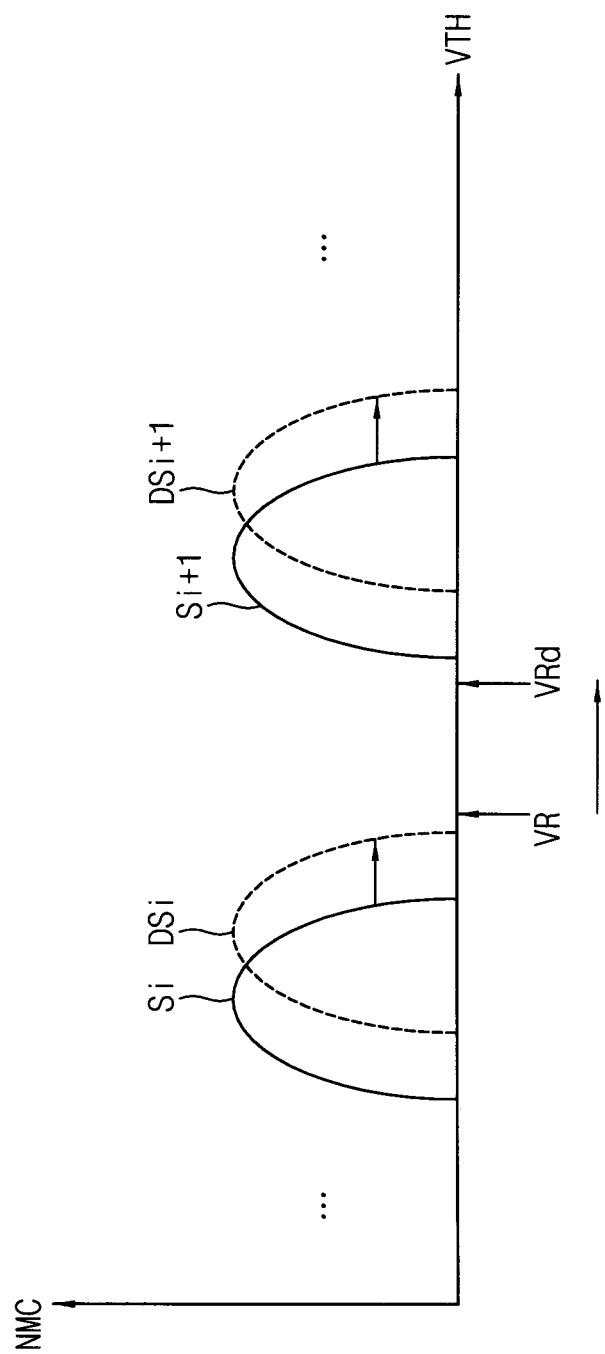

FIGS. 11 and 12 are diagrams for describing changes of threshold voltage distribution of memory cells.

In FIGS. 11 and 12, a horizontal axis indicates a threshold voltage VTH and a vertical axis indicates a number of memory cells having the threshold voltage VTH. FIG. 11 illustrates a change of threshold voltage distribution according to degeneration of data retention characteristics and FIG. 12 illustrates a change of threshold voltage distribution according to degeneration of read disturb characteristics. For convenience of illustration and description, only two adjacent states Si and Si+1 of a plurality of threshold voltage distributions and one read voltage Vr for determining one of the states Si and Si+1 are illustrated in FIGS. 11 and 12. In general, each memory cell may have one of $2^n$ states corresponding to n bits where n is a natural number. In this case, $2^n-1$ read voltages are required to determine the $2^n$ states and the $2^n-1$ read voltages may be referred to as a read voltage set.

As illustrated in FIG. 11, the initial states Si and Si+1 may be changed or shifted to retention-degenerated states RSi and RSi+1 having the lower threshold voltage distributions according to the data retention characteristics related with data retention capability. In this case, the read voltage VR for determining one of the initial states Si and Si+1 is required to be adjusted to a read voltage VRr for determining one of the retention-degenerated states RSi and RSi+1.

As illustrated in FIG. 12, the initial states Si and Si+1 may be changed or shifted to disturb-degenerated states DSi and DSi+1 having the higher threshold voltage distributions according to the read disturb characteristics related with repeated data read. In this case, the read voltage VR for determining one of the initial states Si and Si+1 is required to be adjusted to a read voltage VRd to determine one of the disturb-degenerated states DSi and DSi+1.

Figures 13, 14:
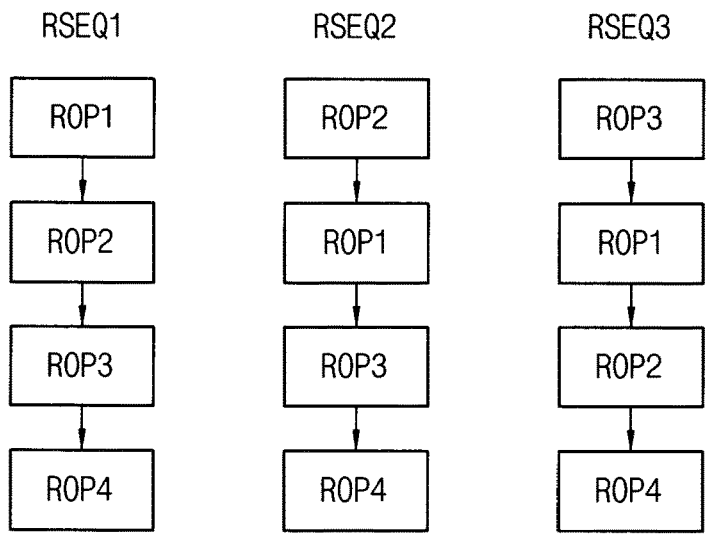
FIG. 13 is a diagram illustrating read sequences according to example embodiments.
FIG. 14 is a diagram illustrating an example format of a command that is transferred from a host device to a storage device.

FIG. 13 is a diagram illustrating read sequences according to example embodiments.

Referring to FIG. 13, a first read sequence RSEQ1, a second read sequence RSEQ2 and a third read sequence RSEQ3 may have different combinations of a plurality of read operations, for example, first through fourth read operations ROP1 through ROP4. For example, the first read operation ROP1 may have a first read voltage set, the second read operation may have a second read voltage set suitable for degeneration of the data retention characteristics, the third read operation ROP3 may have a third read voltage set suitable for degeneration of the read disturb characteristics and the fourth read operation ROP4 may have a fourth read voltage set suitable for variation of an operation temperature. The first read sequence RSEQ1 may be a default read sequence that is determined in advance regardless of the operation environments.

When the stream manager STMNG determines the degeneration of the data retention characteristics with respect to a stream identifier, the stream manager STMNG may determine the second read sequence RSEQ2 as the stream operation conditions for the corresponding stream identifier. As such, the stream manager STMNG may monitor the data retention characteristics with respect to each of the plurality of stream identifiers and select a retention read sequence, that is, the second read sequence RSEQ2 as the stream operation condition among the plurality of read sequences RSEQ1~RSEQ4, such that the read operation ROP2 having the read voltage set corresponding to a case that the data retention characteristics are degenerated may be performed first in accordance with the retention read sequence.

When the stream manager STMNG determines the degeneration of the read disturb characteristics with respect to a stream identifier, the stream manager STMNG may determine the third read sequence RSEQ3 as the stream operation conditions for the corresponding stream identifier. As such, the stream manager STMNG may monitor read disturb characteristics with respect to each of the plurality of stream identifiers and select a disturb read sequence, that is, the third read sequence RSEQ3 as the stream operation condition among the plurality of read sequences RSEQ1~RSEQ4, such that the read operation ROP3 having the read voltage set corresponding to a case that the read disturb characteristics are degenerated may be performed first in accordance with the retention read sequence.

FIG. 14 is a diagram illustrating an example format of a command that is transferred from a storage controller to a storage device, and FIG. 15 is a diagram illustrating an example format of a lowest double word included in the command of FIG. 14. The formats of FIGS. 14 and 15 may be for standard commands that are specified in the NVMe standards.

Referring to FIG. 14, each command may have a predetermined size, for example, 64 bytes. In FIG. 14, a lowest double word CDW0 may be common to all commands. A double word corresponds to four bytes. A namespace identifier (NSID) field may specify a namespace ID to which a command is applied. If the namespace ID is not used for the command, then NSID field may be cleared to 0 h. The 08 through 15 bytes may be reserved. A metadata pointer (MPTR) field may be valid and used only if the command includes metadata. A physical region page (PRP) entry field may specify data used by the command. The upper double words CDW10 through CDW15 may have specific usage for each command.

Referring to FIG. 15, the lowest double word CDW0 may have a predetermined size, for example, four bytes. Important information may be intensively included in the first byte (BYTE=0). The bits B0~B3 of the first byte (BYTE=0) may include access frequency ACCFRQ for a memory region of an address range that are access-requested. In other words, information for write request frequency or read request frequency may be included in the bits B0~B3 of the first byte (BYTE=0). The bits B4 and B5 of the first byte (BYTE=0) may include information on access latency ACCLAT. The access latency for the requested data may be defined by the values of the bits B4 and B5 of the first byte (BYTE=0). The bit B6 of the first byte (BYTE=0) may represent whether the corresponding command is one of the sequential commands. For example, the corresponding command may be one of the sequential commands when the value of the bit B6 is '1', and the information on the sequential commands may not be available when the value of the bit B6 is '0'. The bit B7 of the first byte (BYTE=0) may represent whether the access-requested data are compressed or not. For example, the data may be compressed when the value of the bit B7 is '1' and the information on the data compression may be available when the value of the bit B7 is '1'.

In some example embodiments, the stream identifiers STID may be included in the second byte (BYTE=1). In other example embodiments, the stream identifiers STID may be included in the reserved bytes (BYTE=2 and 3).

In some example embodiments, the stream manager STMNG may determine the stream data characteristics with respect to each of stream identifiers STID based on the access information (e.g., the access frequency ACCFRQ) in the command that is transferred from a storage controller to a storage device or a nonvolatile memory device.

Figure 16:
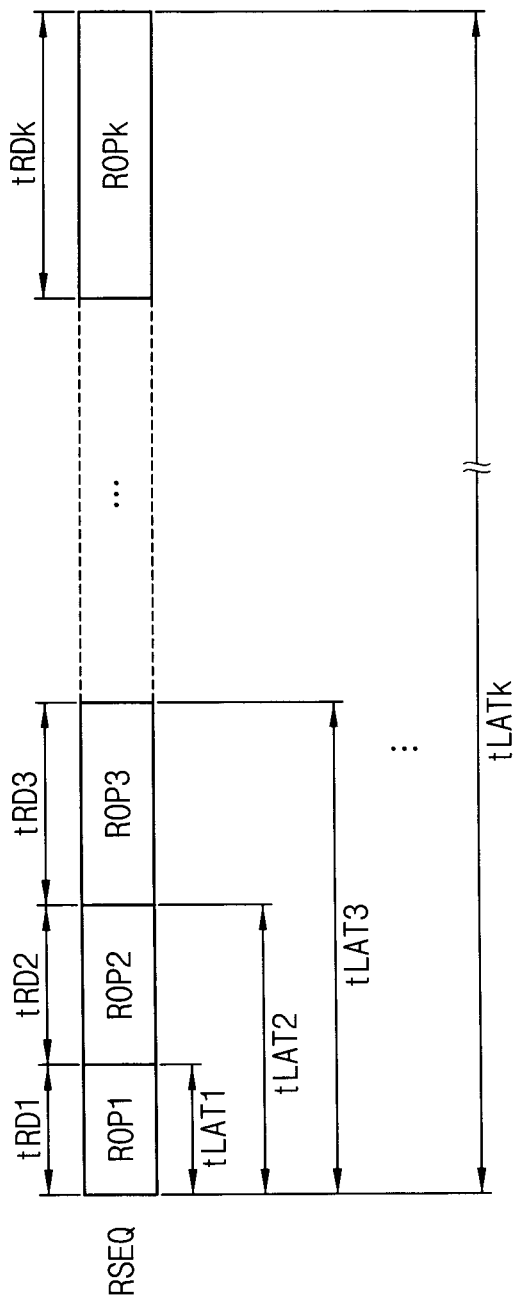
FIG. 16 is a diagram illustrating an example read sequence according to example embodiments.

FIG. 16 is a diagram illustrating an example read sequence according to example embodiments.

Referring to FIG. 16, each read sequence RSEQ may include a plurality of read operations ROP1~ROPk having respective read times tRD1~tRDk different from each other.

There is a trade-off between length of read time and the accuracy of the corresponding read operation. In other words, read operations having shorter read times may have a higher probability of a read fail outcome, while read operations having longer read times may have a higher probability of a successful read operation outcome. Accordingly, each read sequence RSEQ may be set such that a read operation having the shorter read time will be performed before a read operation having the longer read time, as illustrated for example in FIG. 16.

The read latency associated with the selected read sequence corresponds to a sum of the read times of the read operations that are performed until the valid data is obtained. In the illustrated example of FIG. 16, the read latency tLAT1 corresponds to the first read time tRD1 if valid data is obtained by the first read operation ROP1, the read latency tLAT2 corresponds to a sum tRD1+tRD2 for the first read time tRD1 and the second read time tRD2 if valid data is obtained by the second read operation ROP2, the read latency tLAT3 corresponds to a sum tRD1+tRD2+tRD3 for the first read time tRD1, the second read time tRD2 and the third read time tRD3 if valid data is obtained by the third read operation ROP3, and the read latency tLATk corresponds to a sum tRD1+tRD2+ . . . +tRDk of all read times tRD1~tRDk if valid data is obtained by the last read operation ROPk.

Figure 17:
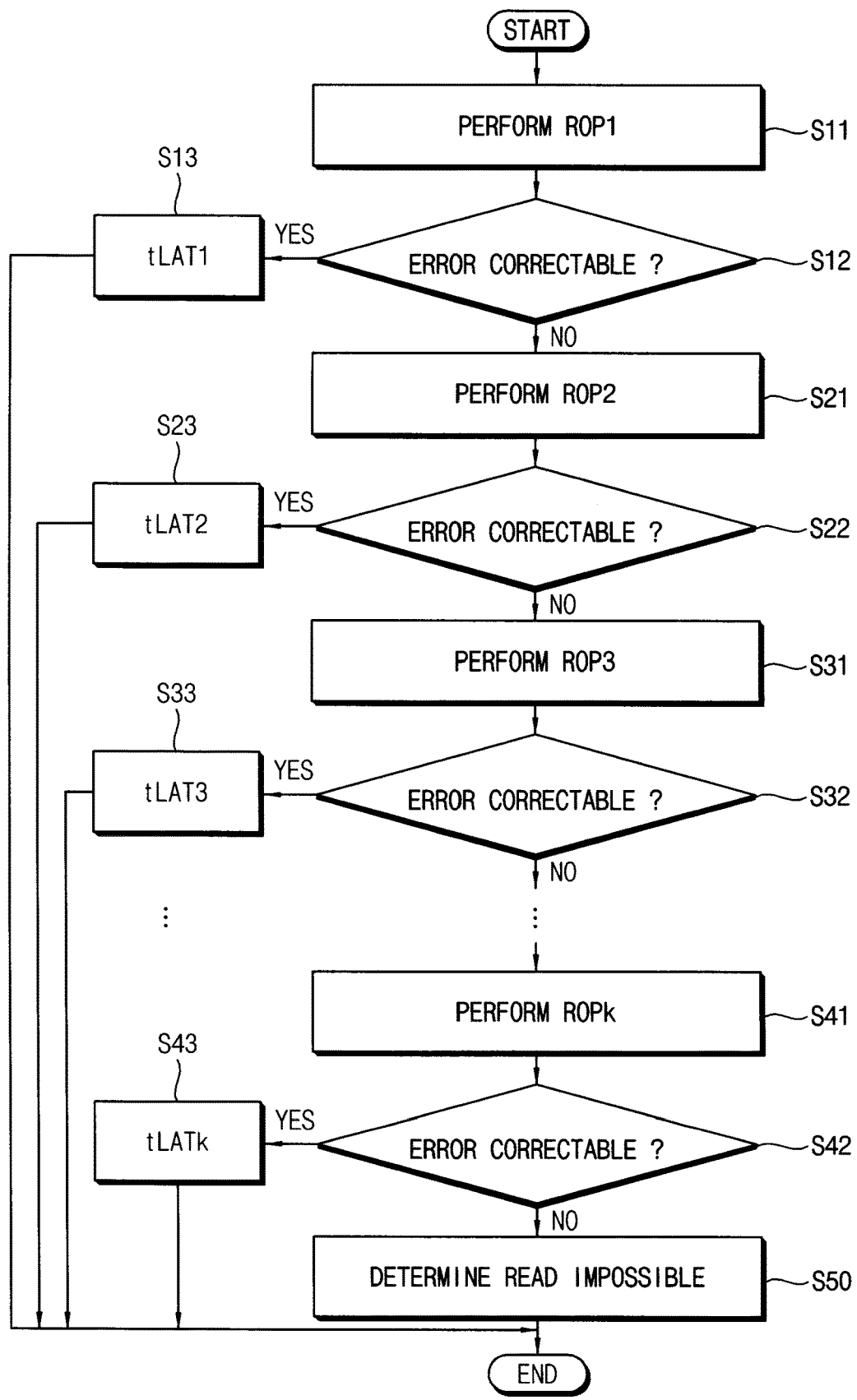
FIG. 17 is a flowchart illustrating a method of reading data in accordance with the read sequence of FIG. 16.

FIG. 17 is a flowchart illustrating a method of reading data in accordance with the read sequence of FIG. 16.

Referring to FIG. 17, according to the set read sequence RSET, the first read operation ROP1 of the highest priority is performed (S11). Here, as with the example of FIG. 16, it is assumed that each read operation is performed in conjunction with ECC decoding. Thus, when error(s) in the read data are determined to be correctable by the ECC decoding (S12=YES), the first read time tRD1 of the first read operation ROP1 is determined as the read latency tLAT1 (S13). Thus, as the error(s), if any, are correctable, valid data is obtained and the read sequence RSEQ is ended.

However, when error(s) are not correctable (S12=NO), the second read operation ROP2 of the next priority is performed (S21). Again, if the resulting error(s) in the read data, if any, are determined to be correctable by the ECC decoding (S22=YES), the sum tRD1+tRD2 of the read times of the first and second read operations ROP1 and ROP2 is determined as the read latency tLAT2 (S23).

However, if the error(s) are not correctable (S22=NO), the third read operation ROP3 of the next priority is performed (S31). Again, if error(s) in the read data, if any, are determined to be correctable by the ECC decoding (S32=YES), the sum tRD1+tRD2+tRD3 of the read times of the first, second and third read operations ROP1, ROP2 and ROP3 is determined as the read latency tLAT3 (S33).

In this manner, so long as valid data is not obtained through the execution of read operations having the higher priorities, variously set read operation are sequentially performed up until a last read operation ROPk is performed (S41). So finally, if the error(s) in the read data, if any, are determined to be correctable by the ECC decoding (S42=YES), then a sum tRD1+tRD2+ . . . +tRDk of the read times of all read operations ROP1~ROPk is determined as the read latency tLATk (S43).

Yet, if valid data is not obtained by the last read operation ROPk, it is determined that the current read operation is determined as failed (S50) (i.e., a read fail occurs), and the read sequence RSEQ is ended.

Depending on the operation environments of the storage device 30 of FIG. 2, for example, valid data may be obtained in the first read operation ROP1. Thus, the read latency may be minimized by use of the illustrated read sequence, such that execution of the overall read operation may be performed with minimal read latency, or valid data may be obtained in a read operation after performing the first read operation. Therefore, second and possibly subsequent read operations having respective priorities may be performed. This will obviously increase the read latency of the overall read operation. In an example embodiment, the storage device 30 with less use may output valid data in the first read operation ROP1. However, the storage device 30 that degrades with frequent use may output valid data in a read operation after performing the first read operation, which causes to increase read latency.

According to example embodiments, the performance of the nonvolatile memory device may be enhanced by setting a plurality of read sequences and determining the optimal read sequence among the set read sequences with respect to each of the stream identifiers.

Figure 18:
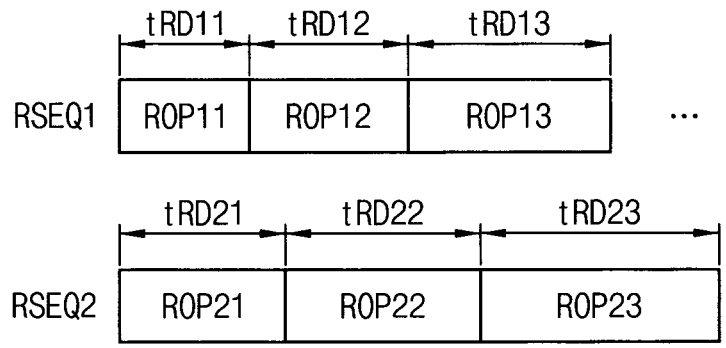
FIG. 18 is a diagram illustrating a plurality of read sequences according to example embodiments.

FIG. 18 is a diagram illustrating a plurality of read sequences according to example embodiments.

FIG. 18 illustrates a non-limiting example of two read sequences of three or more read operations that may be set according example embodiments. As described above, each of the first read sequence RSEQ1 and the second read sequence RSEQ2 may be set such that the read operation having the shorter read time is performed before the read operation having the longer read time. For example, the read times of the read operations ROP11, ROP12 and ROP13 in the first read sequence RSEQ1 may satisfy the relation tRD11<tRD12<tRD13, and the read times of the read operations ROP21, ROP22 and ROP23 in the second read sequence RSEQ2 may satisfy the relation tRD21<tRD22<tRD23.

In some example embodiments, the first read sequence RSEQ1 may be set such that the first read operation ROP1 having a first read time tRD11 is performed first in the first read sequence RSEQ1, and the second read sequence RSEQ2 may be set such that the second read operation tRD21 having a second read time tRD21 longer than the first read time tRD11 is performed first in the second read sequence RSEQ2. As the probability of read success by the first read operation ROP11 is increased, the first read sequence RSEQ1 is more proper than the second read sequence RSEQ2. In contrast, as the probability of read success by the first read operation ROP11 is decreased, the second read sequence RSEQ2 is more proper than the first read sequence RSEQ1.

Figure 19:
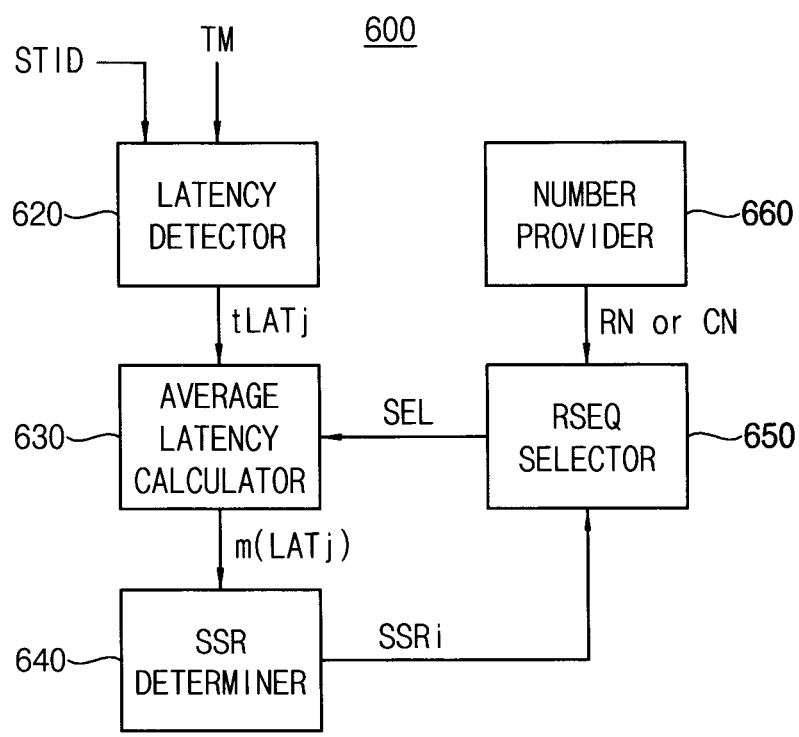
FIG. 19 is a block diagram illustrating an example of a read sequence controller in a nonvolatile memory device according to example embodiments.

FIG. 19 is a block diagram illustrating an example of a read sequence controller in a nonvolatile memory device according to example embodiments.

Referring to FIG. 19, a read sequence controller 600 includes a latency detector 620, an average latency calculator 630, a sequence selection rate (SSR) determiner 640, read sequence (RSEQ) selector 650 and a number provider 660. In an example embodiment, the read sequence controller 600 may be included in the stream manager STMNG of FIG. 2.

The latency detector 620 may provide a current read latency tLATj of the selected read sequence based on a timing signal TM and a stream identifier STID whenever the selected read sequence is finished. For example, the timing signal TM may include a signal indicating a timing point when the original read command is generated or received and a signal indicating a timing point when the read success is determined by ECC decoding.

The average latency calculator 630 may provide an average latency m(tLATj) of the selected read sequence based on the current read latency tLATj and a selection signal SEL. The read sequence corresponding to the current read latency tLATj may be selected based on the selection signal SEL to update the average latency m(tLATj) of the corresponding read sequence using the current read latency tLATj.

The SSR determiner 640 may adjust the sequence selection rates SSRi based on the average latencies respectively corresponding to the read sequences. For example, when the three read sequences RSEQ1, RSEQ2 and RSEQ3 are set, the SSR determiner 640 may provide three sequence selection rates SSR1, SSR2 and SSR3. The SSR determiner 140 may determine a main read sequence among the read sequences so that the main read sequence may correspond to the read sequence having a minimum average latency among the average latencies, and set the sequence selection rate of the main read sequence larger than the sequence selection rates of the other read sequences.

For example, the first read sequence RSEQ1 may have the minimum average latency in early stage of using the nonvolatile memory device, and the first read sequence RSEQ1 may be set as the main read sequence. If the minimum value of the sequence selection rate is 0.05 for at least monitoring the read latencies, the sequence selection rates may be determined as SSR1=0.90, SSR2=0.05 and SSR3=0.05. In case that the operational condition is changed and the main read sequence is changed from the first read sequence RSEQ1 to the second read sequence RSEQ2, the sequence selection rates may be adjusted to SSR1=0.05, SSR2=0.90 and SSR3=0.05.

The RSEQ selector 650 may generate the selection signal SEL that indicates what read sequence is selected and performed currently. For example, when SSR1=0.90, SSR2=0.05 and SSR3=0.05, the RSEQ selector generates the selection signal SEL such that the first read sequence RSEQ1 may be selected ninety times out of one hundred, the second read sequence RSEQ2 may be selected five times out of one hundred, and the third read sequence RSEQ3 may be selected five times out of one hundred. The selection signal SEL may be provided from the above-described stream manager STMNG, and the stream manager STMNG may select a proper read sequence for each stream identifier STID based on the selection signal SEL.

In some example embodiments, the RSEQ selector 150 may select the read sequences irregularly based on a random number RN and the sequence selection rates SSRi.

Figure 20:
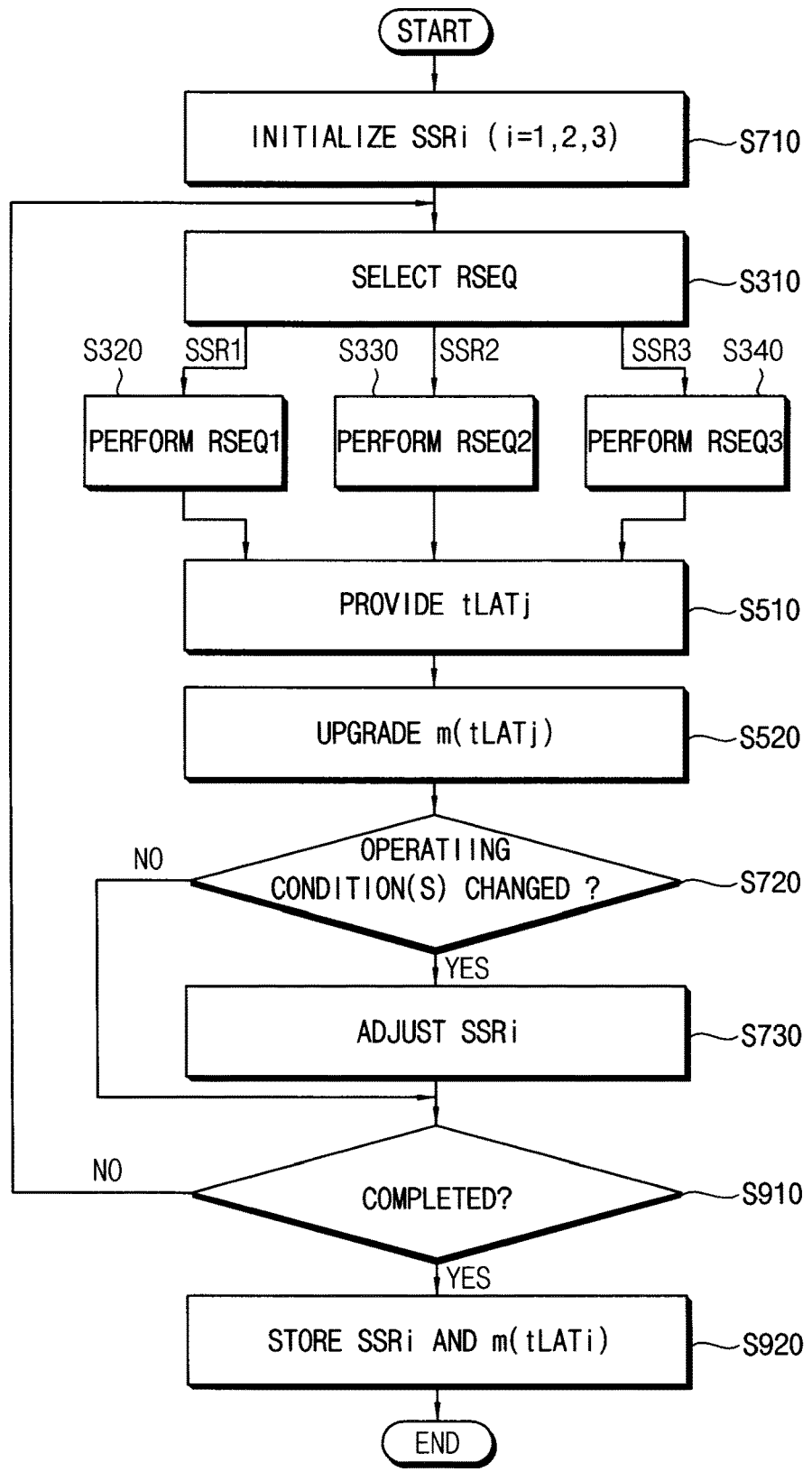
FIG. 20 is a flowchart illustrating a method of controlling a read sequence of a nonvolatile memory device according to an example embodiment.

FIG. 20 is a flowchart illustrating a method of controlling a read sequence of a nonvolatile memory device according to an example embodiment.

Referring to FIG. 20, the sequence selection rates SSRi respectively corresponding to the read sequences RSEQi are initialized (S710). The initialized sequence selection rates SSRi are adjusted or maintained whenever one read sequence is performed depending on the change of the operational condition.

One read sequence is selected (S310) among the read sequences RSEQi based on the current read selection rates SSRi and the selected one read sequence RSEQj is performed each time (S320, S330, S340). The current read latency tLATj of the selected read sequence RSEQj is provided (S510) after the read sequence RSEQj is finished as described with reference to FIG. 3. The corresponding average latency m(tLATj) is upgraded (S520) using the provided current read latency tLATj. Based on the average latencies m(tLAT1), m(tLAT2) and m(tLAT3), it is determined whether the operational condition is changed (S720). When the operational condition is determined as changed (S720: YES), the sequence selection rates SSRi are adjusted (S730) to reflect or compensate the change of the operational condition. When the operational condition is determined as not changed (S720: NO), the sequence selection rates SSRi are maintained.

When the operation of the nonvolatile memory device is completed (S910: YES), the current sequence selection rates SSRi and the current average latencies m(tLATi) may be stored in the memory controller or the nonvolatile memory device. When the operation of the nonvolatile memory device is not completed (S910: NO), the above-mentioned processes are repeated based on the adjusted or maintained sequence selection rates SSRi.

As such, whenever one read sequence is performed, the read latencies may be monitored and the sequence selection rates may be adjusted based on the monitoring results to enhance the performance of the nonvolatile memory device.

Figure 21:
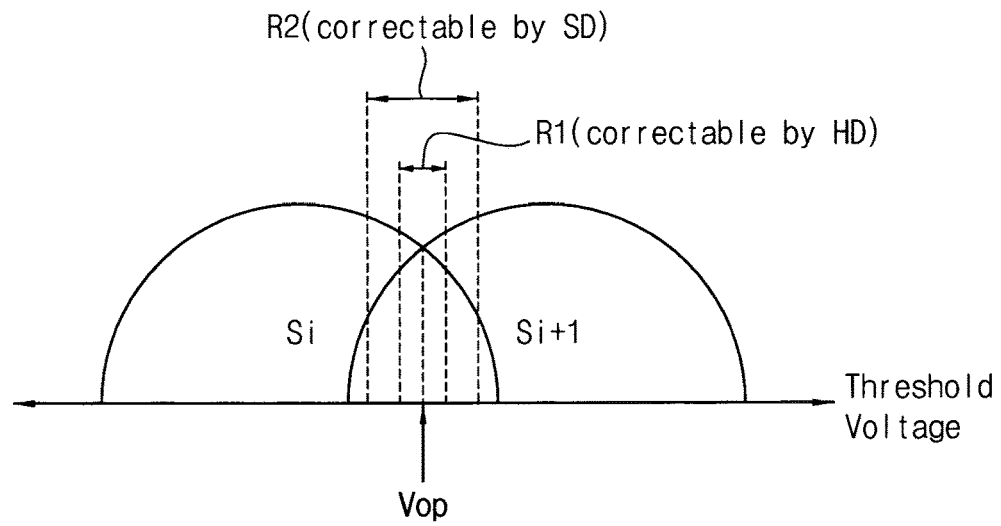
FIG. 21 is a diagram for describing a predetermined read voltage and an optimal read voltage.

FIG. 21 is a diagram for describing a predetermined read voltage and an optimal read voltage.

FIG. 21 illustrates threshold voltage distributions of two adjacent states Si and Si+1 in a flash memory device as an example. An optimal read voltage Vop is a read voltage leading to a minimum number of error bits among data bits that are read out simultaneously. The optimal read voltage Vop corresponds to a valley, that is, a cross point of the threshold voltage distributions of the two states Si and Si+1. When the distributions are shifted and/or broadened according to change of the operational condition, the difference between the predetermined read voltage and the optimal read voltage occurs. As the difference is increased, the bit error rate (BER) or the probability of the read fail is increased.

When the predetermined voltage is included in a first voltage range R1, the error in the read data may be corrected by ECC decoding with hard decision (HD). When the predetermined voltage is included in a second voltage range R2, the error in the read data may be corrected by ECC decoding with soft decision (SD). The HD and SD will be further described below with reference to FIGS. 30 and 31.

When the bit errors in the read data are too many and the predetermined read voltage is out of the second range R2, the valid data may not be obtained by the ECC decoding. When the valid data are not obtained through the previous read operations based on the predetermined read voltage, a valley search operation may be performed to determine the optimal read voltage Vop and then a read operation may be performed again based on the optimal read voltage. Such valley search operation and the read operation based on the optimal read operation may be referred to as a voltage-compensation read operation. In some example embodiments, each of the read sequences may include the read operation based on the predetermined read voltage with the higher priority and the at least one voltage-compensation read operation with the lower priority, as illustrated in FIGS. 22, 23 and 24.

Figure 22:
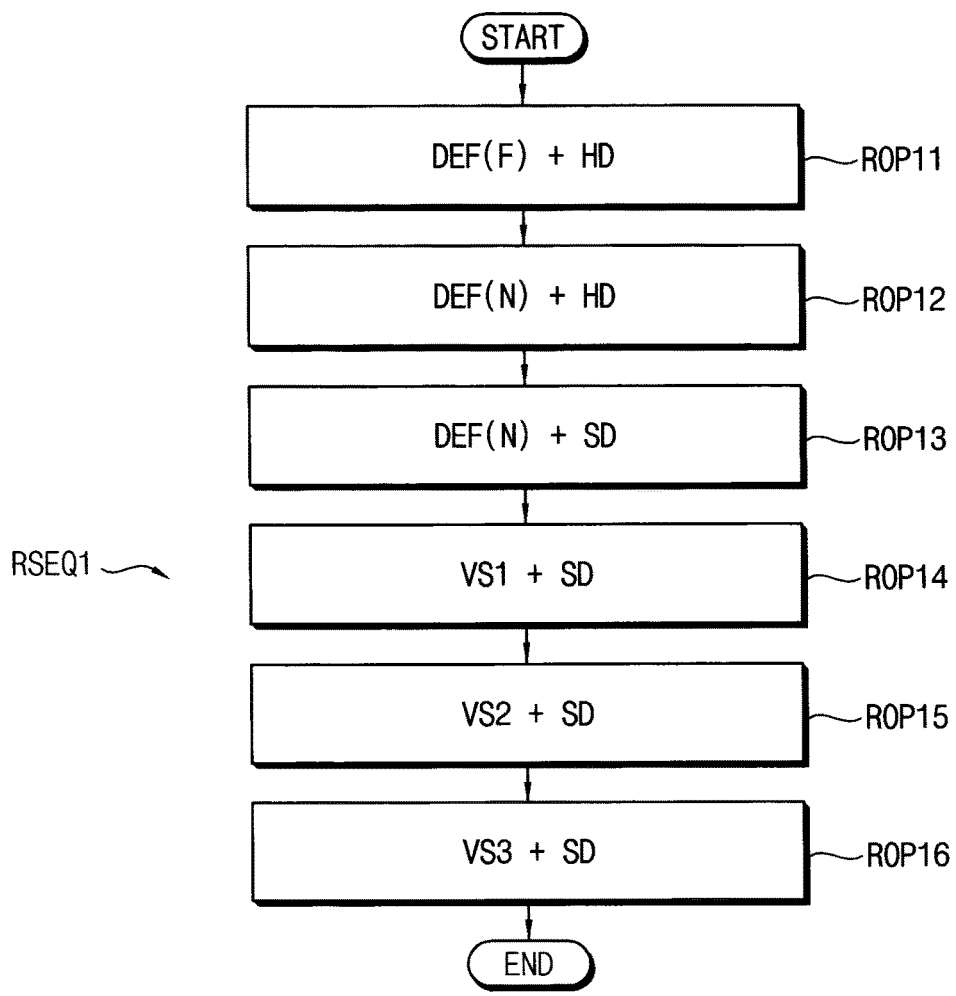
FIGS. 22, 23 and 24 are diagrams illustrating read sequences according to example embodiments.
Figure 23:
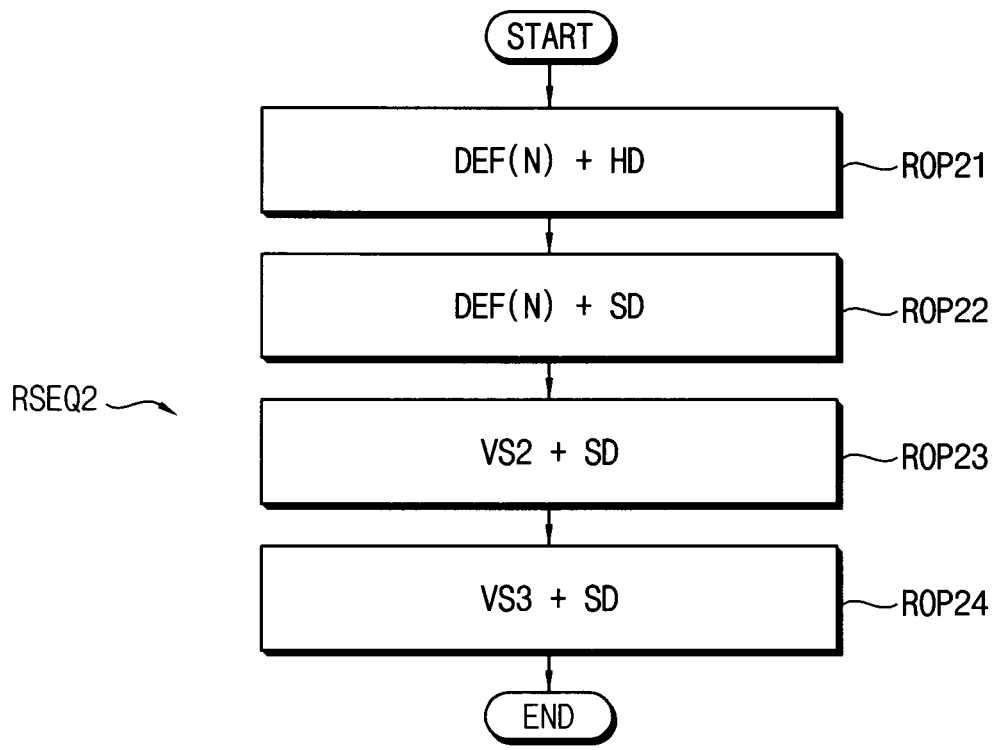
Figure 24:
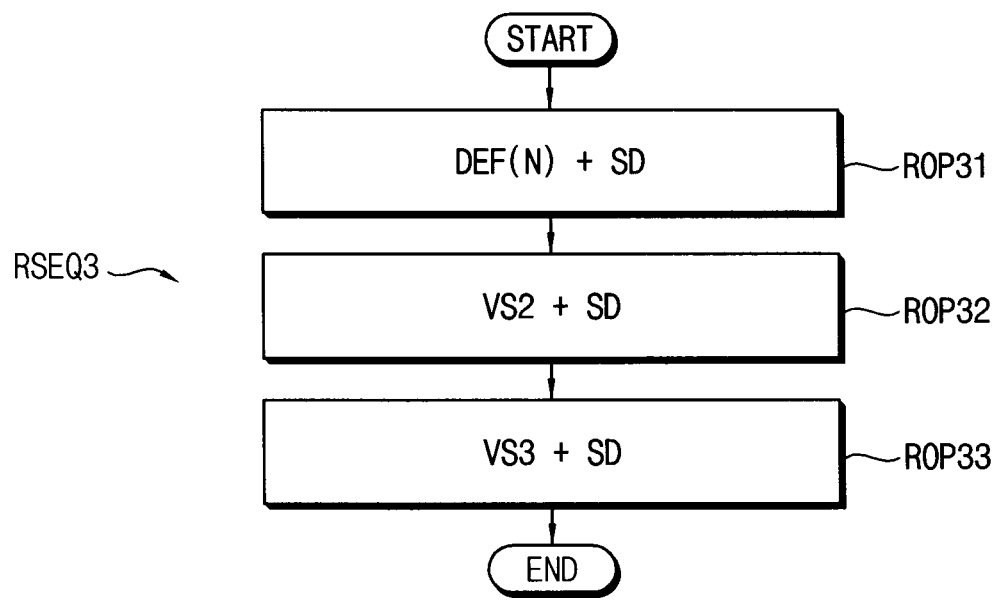

FIGS. 22, 23 and 24 are diagrams illustrating read sequences according to example embodiments.

Referring to FIG. 22, the first read sequence RSEQ1 may include first through sixth read operations ROP11~ROP16, which are arranged according to respective priorities. The first, second and third read operations ROP11, ROP12 and ROP13 may be based on the predetermined read voltage, and the fourth, fifth and sixth read operations ROP14, ROP15 and ROP16 may be the voltage-compensation read operations.

As described above, a read operation having the shorter read time may be performed before a read operation having the longer read time. In other words, the priory of the read operations may be higher as the read time is shorter. The first read operation ROP11 having the shortest read time, that is, the first read time tRD11 may be performed first, the second read operation ROP12 having the second read time tRD12 longer than the first read time tRD11 is performed after the first read operation ROP11, and the sixth read operation ROP16 having the longest read time tRD16 is performed lastly.

Each of the first and second read operations ROP11 and ROP12 may be a hard decision (HD) read operation that reads out hard decision data using the predetermined read voltage and performs the ECC decoding based on the hard decision data. As will be described in some additional detail with reference to FIGS. 25 and 26, the first read operation ROP11 may be a fast read operation DEF(F) based on the predetermined read voltage and the second read operation ROP12 may be a normal read operation DEF(N) based on the predetermined read voltage.

The third read operation ROP13 may be a soft decision (SD) read operation that reads out the hard decision data using the predetermined read voltage, provides reliability information of the hard decision data using a plurality of read voltages around the predetermined read voltage, and performs the ECC decoding based on the hard decision data and the reliability information.

The fourth, fifth and sixth read operations ROP14, ROP15 and ROP16 may be the voltage-compensation read operations including the valley search operations VS1, VS2 and VS3 and the read operations based on the detected optimal read voltages, respectively. The valley search operations VS1, VS2 and VS3 may be variously implemented to have different search times and different reading accuracies.

Referring to FIG. 23, the second read sequence RSEQ2 may include first through fourth read operations ROP21~ROP24, which are arranged according to respective priorities. The first and second read operations ROP21 and ROP22 may be based on the predetermined read voltage, and the third and fourth read operations ROP23 and ROP24 may be the voltage-compensation read operations.

Referring to FIG. 24, the third read sequence RSEQ3 may include first, second and third read operations ROP31, ROP32 and ROP33, which are arranged according to respective priorities. The first read operation ROP31 may be based on the predetermined read voltage, and the second and third read operations ROP32 and ROP33 may be the voltage-compensation read operations.

For example, the first read sequence RSEQ1 of FIG. 22 may be set for the operation environments of the relatively lower range of the BER, the second read sequence RSEQ2 of FIG. 23 may be set for the operation environments of the intermediate range of the BER, and the third read sequence RSEQ3 of FIG. 24 may be set for the operation environments of the relatively higher range of the BER. As such, the performance of the nonvolatile memory device may be improved by setting a plurality of read sequences respectively corresponding to the different operation environments and adaptively controlling the read sequences.

Figure 25:
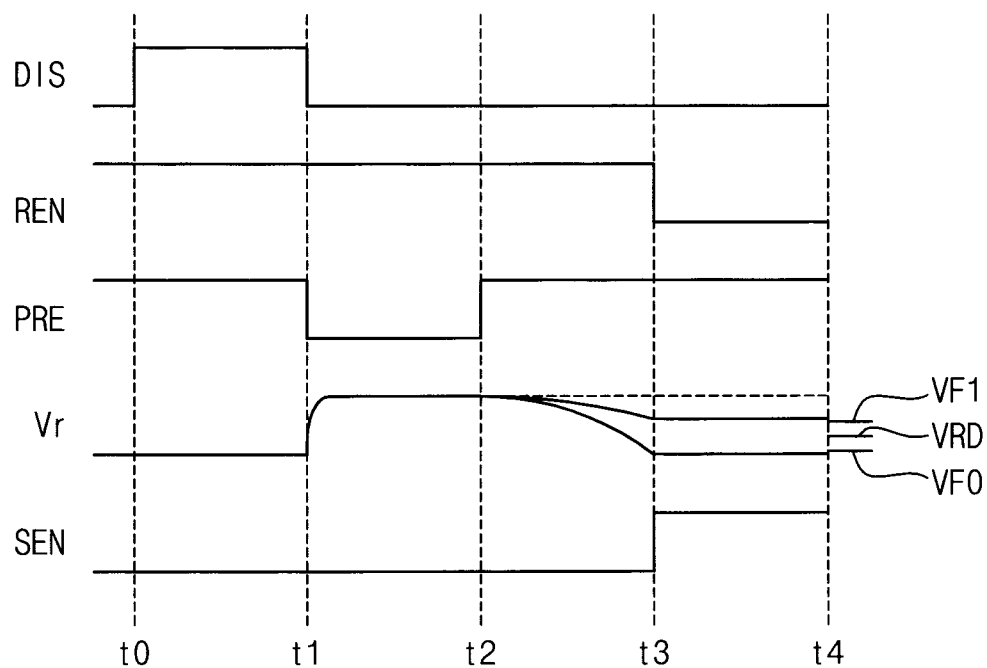
FIG. 25 is a timing diagram illustrating an example of a read process of a nonvolatile memory device.
Figure 26:
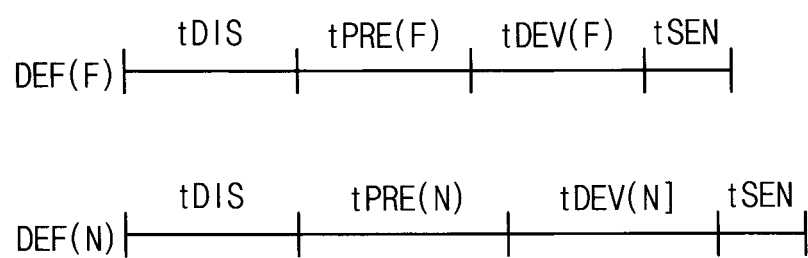
FIG. 26 is a diagram for describing a read time according to the read process of FIG. 25.

FIG. 25 is a timing diagram illustrating an example of a read process (i.e., read operation) of a nonvolatile memory device, and FIG. 26 is a diagram for describing a read time according to the read process of FIG. 25.

Referring to FIG. 25, when a discharge signal DIS is activated to a logic high level during a discharge period t0~t1, the bitline voltage Vr is initialized to a ground voltage. When a precharge signal PRE is activated to a logic low level during a precharge period t1~t2, the bitline voltage Vr is charged with the precharge voltage. When the precharge signal PRE is deactivated to a logic high level during a develop period t2~t3, the precharge voltage is blocked and the bitline voltage Vr is decreases, where the bitline is connected to the ground voltage through the resistive element of the selected memory cell. The voltage VF1 of the bitline coupled to the off-cell of the relatively higher resistance decreases slowly and the voltage VF0 of the bitline coupled to the on-cell of the relatively lower resistance decreases rapidly.

When a sense enable signal SEN is activated to a logic high level during a sense period t3~t4, the bitline voltage VF1 or VF0 is compared with a read voltage VRD and the data bit stored in the selected memory cell may be read out.

FIG. 26 illustrates examples of the fast read operation DEF(F) and the normal read operation DEF(N) which are mentioned in FIG. 22. The data read time may include a discharge time tDIS, a precharge time tPRE, a develop time tDEV and a latching or sensing time tSEN. The accuracy or reliability of the read data may be enhanced as the precharge time tPRE or the develop time tDEV is increased. As illustrated in FIG. 26, the sum of the precharge time tPRE(F) and the develop time tDEV(F) of the first read operation ROP11 may be shorter than the sum of the precharge time tPRE(N) and the develop time tDEV(N) of the second read operation ROP12.

Figure 27:
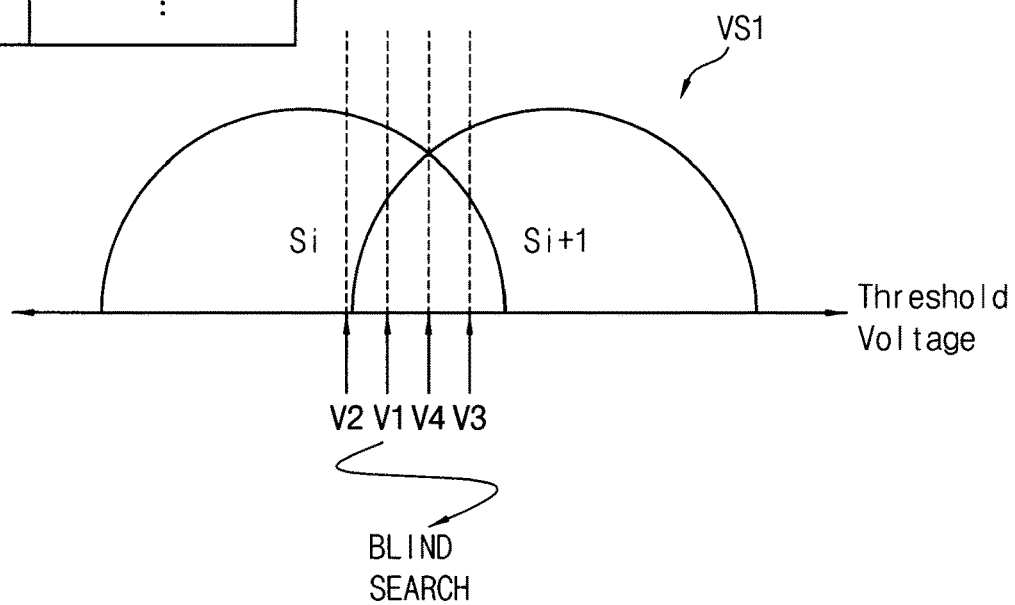
FIGS. 27, 28 and 29 are diagram illustrating valley search methods according to example embodiments.
Figure 28:
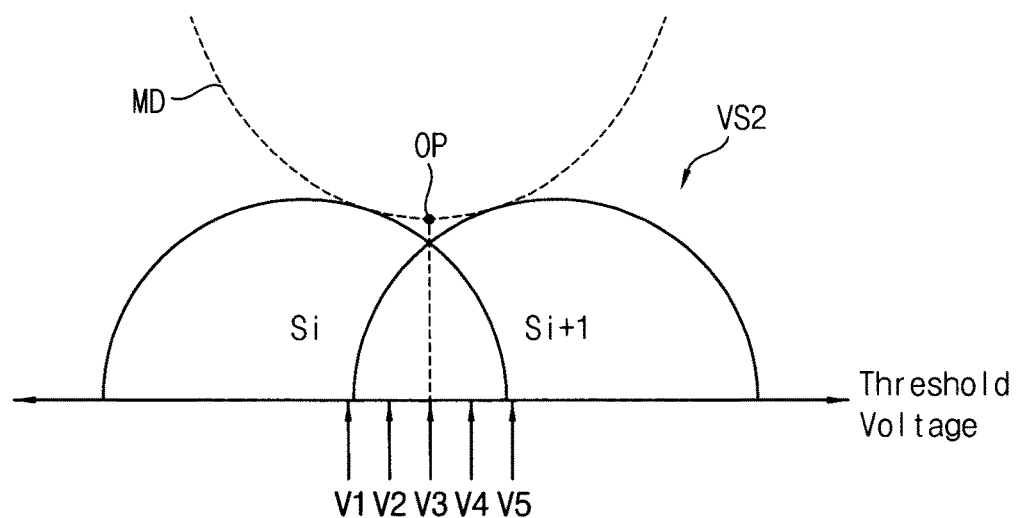
Figure 29:
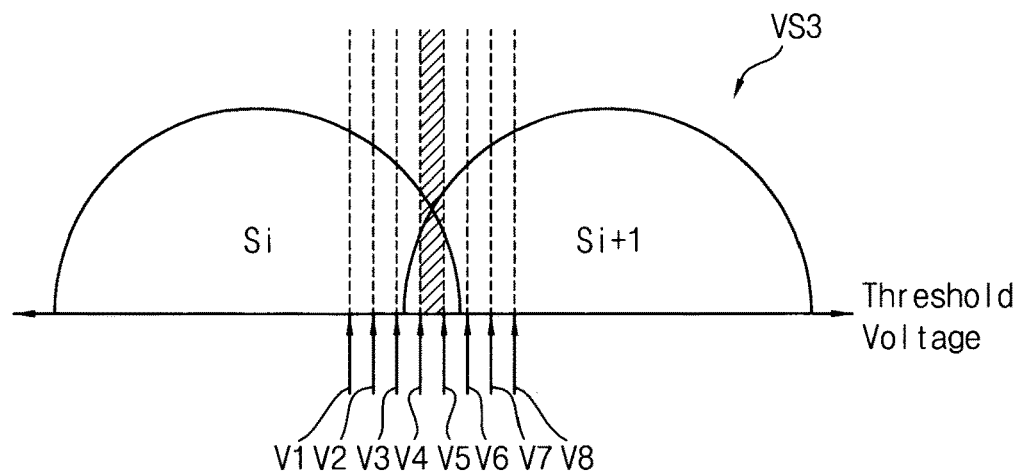

FIGS. 27, 28 and 29 are diagram illustrating valley search methods according to example embodiments.

Referring to FIG. 27, an offset table may be provided by analyzing the shift trends of the memory cells through the various test processes. The first valley search method VS1 may be performed by referring to the offset table and testing a plurality of read voltages V1~V4 having higher probability of valley with a blind searching scheme.

Referring to FIG. 28, the second valley search method VS2 may be performed by scanning the distributions around the valley using a plurality of read voltages V1~V5 and modeling the second-order curve MD. The voltage corresponding to the vertex of the modeled curve MD may be determined as the optimal read voltage.

Referring to FIG. 29, the third valley search method may be performed by searching the valley point using a plurality of read voltages V1~V8 of relatively narrow intervals. The voltage corresponding to a minimum cell number may be determined as the optimal voltage.

The first valley search method VS1 requires the shortest search time but the lowest accuracy. In contrast, the third valley search method VS3 requires the longest search time but the highest accuracy. As such, the read sequences RSEQ1, RSEQ2 and RSEQ3 described with reference to FIGS. 9, 10 and 11 may be set using the various valley search methods or operations VS1, VS2 and VS3 having different searching times and accuracies.

Figure 30:
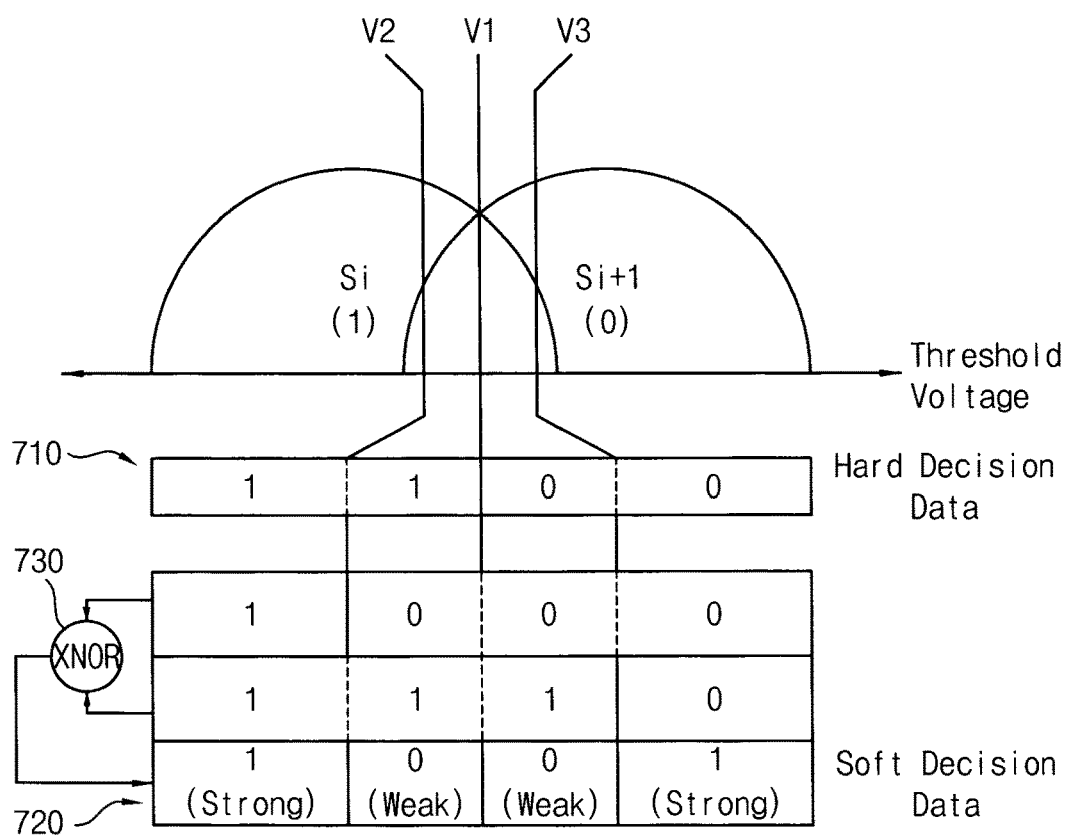
FIG. 30 is a diagram for describing an example of a 2-bit soft decision read operation.
Figure 31:
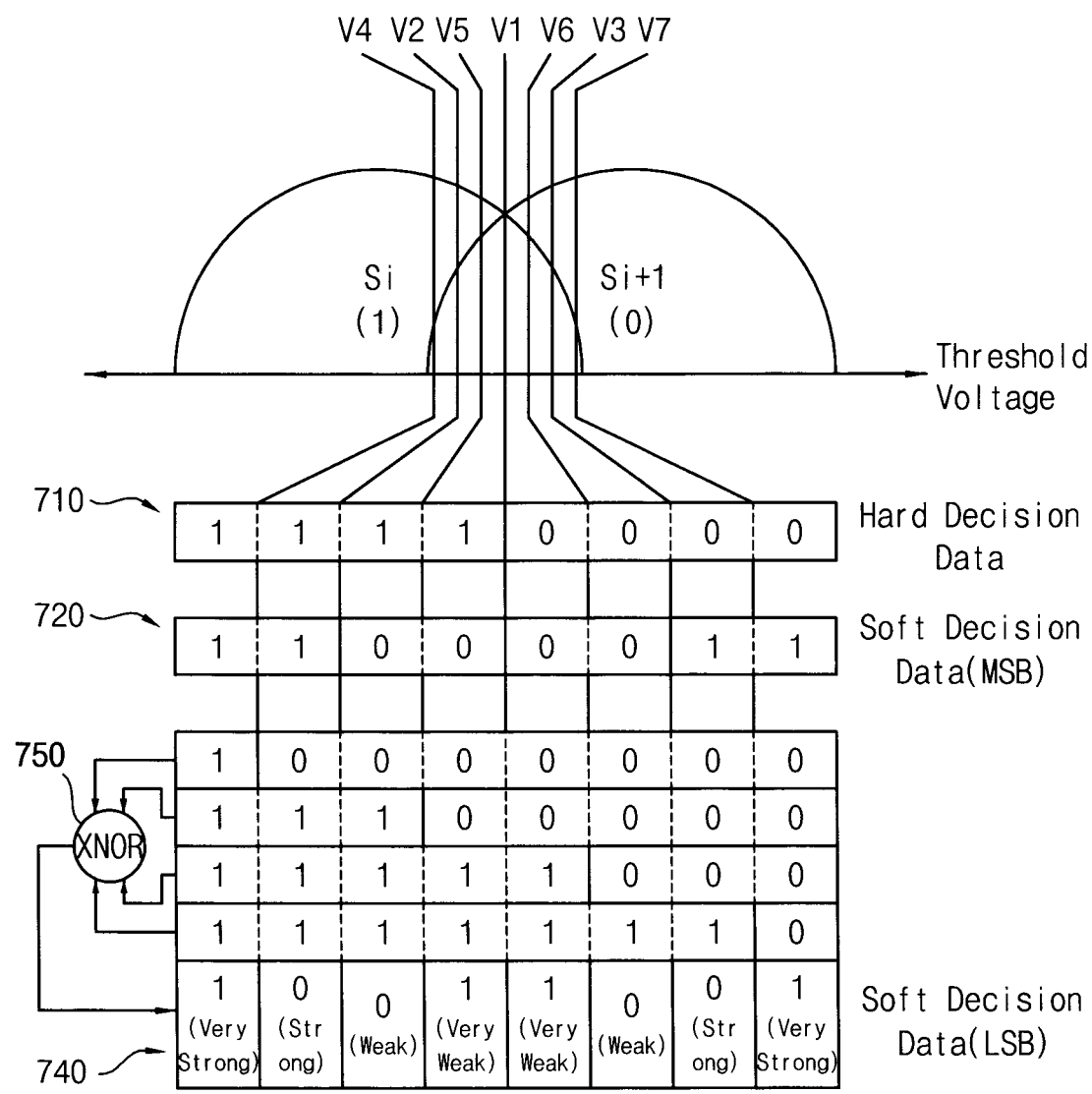
FIG. 31 is a diagram for describing an example of a 3-bit soft decision read operation.

FIG. 30 is a diagram for describing an example of a 2-bit soft decision read operation, and FIG. 31 is a diagram for describing an example of a 3-bit soft decision read operation.

For example, as illustrated in FIG. 30, the nonvolatile memory device may perform a 2-bit soft decision read operation. The 2-bit soft decision read operation may include three read operations using three voltages V1, V2 and V3 having regular intervals. For example, the three voltages V1, V2 and V3 may include a first voltage V1 having a predetermined reference level for determining one of a first state Si corresponding to data '1' and a second state Si+1 corresponding to data '0', a second voltage V2 lower by a predetermined level than the first voltage V1, and a third voltage V3 higher by the predetermined level than the first voltage V1. In some example embodiments, data 710 read by using the first voltage V1 having the reference level may be hard decision data 710 read by a hard decision read operation, and the 2-bit soft decision read operation may use the hard decision data 710 read by the hard decision read operation without applying the first voltage V1 having the reference level. The 2-bit soft decision read operation may generate soft decision data 720 having reliability information for the hard decision data 710 by performing a predetermined logical operation (e.g., an XNOR operation 730) (or encoding) on data read by using the second voltage V2 and data read by using the third voltage V3. Each bit of the soft decision data 720 may represent a degree of reliability of a corresponding bit of the hard decision data 710. For example, a bit of the soft decision data 720 having a value of '1' may represent that a corresponding bit of the hard decision data 710 has a first reliability, and a bit of the soft decision data 720 having a value of '0' may represent that a corresponding bit of the hard decision data 710 has a second reliability. In an example embodiment, the first reliability may indicate 'being more reliable' than the second reliability. In other words, the hard decision data 710 with the first reliability may be relatively more reliable than the hard decision data 710 with the second reliability.

In other examples, as illustrated in FIG. 31, the nonvolatile memory device may perform a 3-bit soft decision read operation. The 3-bit soft decision read operation may include seven read operations using seven voltages V1, V2, V3, V4, V5, V6 and V7 having regular intervals. For example, the seven voltages V1, V2, V3, V4, V5, V6 and V7 may include the three voltages V1, V2 and V3 used in the 2-bit soft decision read operation, and may further include a fourth voltage V4 lower than the second voltage V2, a fifth voltage V5 between the second voltage V2 and the first voltage V1, a sixth voltage V6 between the first voltage V1 and the third voltage V3, and seventh voltage V7 higher than the third voltage V3. In some example embodiments, the data 710 read by using the first voltage V1 may be the hard decision data 710 read by the hard decision read operation. The data 720 read by using the second and third voltages V2 and V3 may be most significant bit (MSB) soft decision data 720 corresponding to the soft decision data 720 read by the 2-bit soft decision read operation. The 3-bit soft decision read operation may generate least significant bit (LSB) soft decision data 740 by performing a predetermined logical operation (e.g., an XNOR operation 750) (or encoding) on data read by using the fourth voltage V4, the fifth voltage V5, the sixth voltage V6 and the seventh voltage V7. Each soft decision data 720 and 740 having two bits may represent a degree of reliability of a corresponding bit of the hard decision data 710. For example, each soft decision data 720 and 740 having a value of '11' may represent that a corresponding bit of the hard decision data 710 has a first reliability, each soft decision data 720 and 740 having a value of '10' may represent that a corresponding bit of the hard decision data 710 has a second reliability, each soft decision data 720 and 740 having a value of '00' may represent that a corresponding bit of the hard decision data 710 has a third reliability, each soft decision data 720 and 740 having a value of '01' may represent that a corresponding bit of the hard decision data 710 has a fourth reliability. In an example embodiment, the first reliability, the second reliability, the third reliability and the fourth reliability may be less reliable in the listed order.

Figures 32, 33:
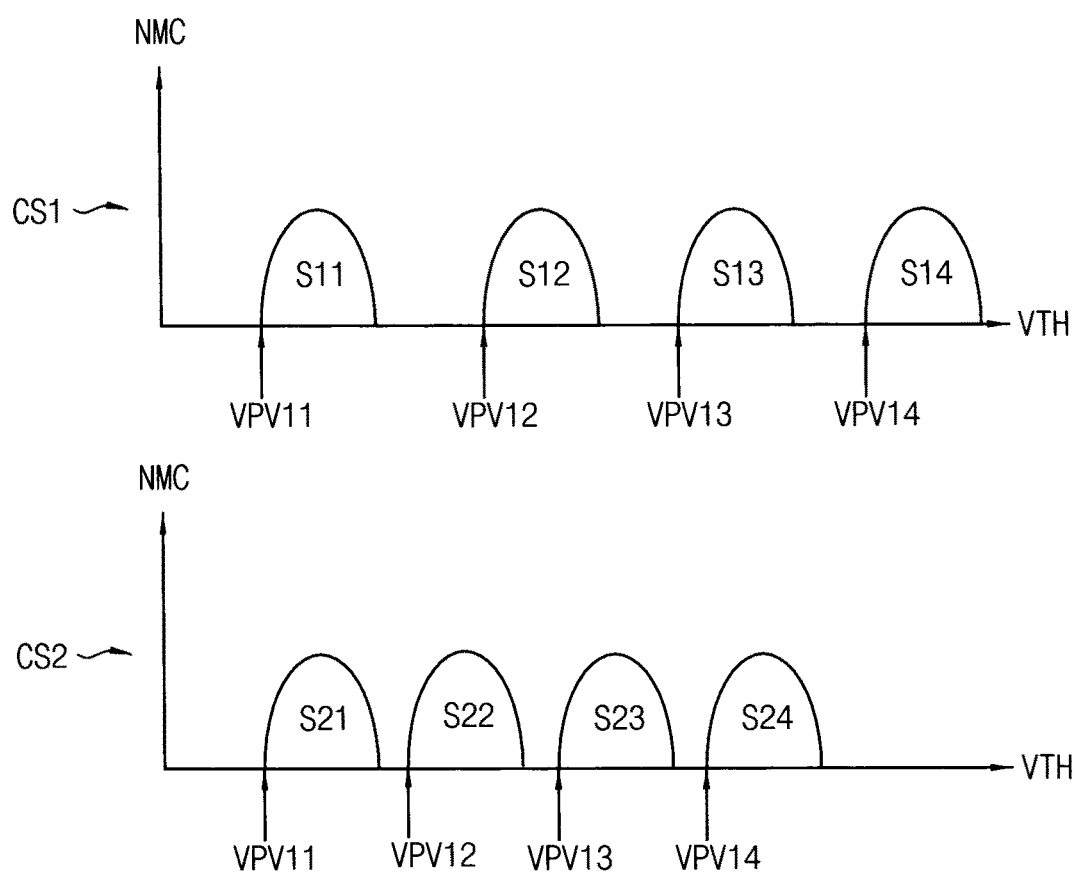
FIG. 32 is diagram illustrating an example embodiment of a cell characteristic table of a stream manager included in a nonvolatile memory device according to example embodiments.
FIG. 33 is a diagram for describing program operation conditions according to example embodiments, and FIG. 34 a diagram for describing erase operation conditions according to example embodiments.

FIG. 32 is diagram illustrating an example embodiment of a cell characteristic table of a stream manager included in a nonvolatile memory device according to example embodiments.

Referring to FIG. 32, a cell characteristic table CCT may include mapping information between physical addresses PHYADD of a nonvolatile memory device and degeneration characteristics MCLC of memory cells. The physical addresses PHYADD may be addresses of a memory block corresponding to a unit of an erase operation or addresses of a page corresponding to a unit of a write operation and a read operation.

The stream manager STMNG may monitor the degeneration characteristics MCLC with respect to each of the physical addresses PA1 and PA2, and determine the above-described stream operation conditions respectively corresponding to the stream identifiers based on the degeneration characteristics CCH1 and CCH2. In some example embodiments, the degeneration characteristics CCH1 and CCH2 may be program-erase (PE) cycles of the corresponding physical addresses PA1 and PA2.

Figure 34:
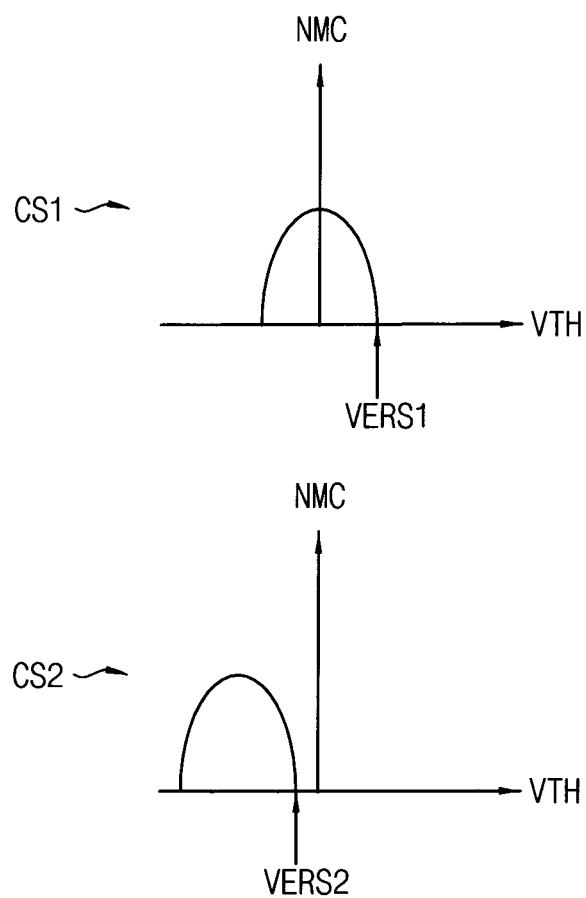

FIG. 33 is a diagram for describing program operation conditions according to example embodiments, and FIG. 34 a diagram for describing erase operation conditions according to example embodiments.

The above-described operation conditions may include program operation conditions and/or erase operation conditions.

Referring to FIG. 33, threshold voltage distributions or states of memory cells may be changed depending on different program operation conditions. The different program operation conditions may include different program voltages, different program verification voltages or different program times.

In FIG. 33, a first case CS1 corresponds to a data stream with a stream identifier of an operation environment such as the data retention characteristics, the read disturb characteristics, the program-erase cycle, etc. with a first degree of degeneration, and a second case CS2 corresponds to a stream identifier of an operation environment with a second degree of degeneration smaller than the first degree thereof. When the degeneration is relatively much, states S11~S14 having greater read margins may be programmed using program verification voltages VPV11~VPV14 of greater intervals. In contrast, when the degeneration is relatively less, states S21~S24 having smaller read margins may be programmed using program verification voltages VPV21~VPV24 of smaller intervals.

Referring to FIG. 34, threshold voltage distributions or states of memory cells may be changed depending on different erase operation conditions. The different erase operation conditions may include different erase voltages, different erase verification voltages or different erase times.

In FIG. 34, a first case CS1 corresponds to a stream identifier of relatively less degeneration of the operation environments such as the data retention characteristics, the read disturb characteristics, the program-erase cycle, etc., and a second case CS2 corresponds to a stream identifier of relatively much degeneration. When the degeneration is relatively less, an erased state of relatively higher threshold voltage distribution may be implemented using a higher erase verification voltage VERS1. In contrast, the degeneration is relatively much, an erased state of relatively lower threshold voltage distribution may be implemented using a lower erase verification voltage VERS2.

As described above, the storage device supporting multi-streaming and the method of controlling an operation of a nonvolatile memory device according to example embodiments may enhance performance of the nonvolatile memory device and the storage device including the nonvolatile memory device by setting the stream operation conditions suitable for the stream data characteristics.

The inventive concept may be applied to any electronic devices and systems supporting multi-streaming. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of controlling an operation of a nonvolatile memory device, the method comprising:
   receiving multiple commands and multiple data streams, wherein each command of the multiple commands has a corresponding one stream identifier of multiple stream identifiers, and each data stream of the multiple data streams is allocated to a corresponding one stream identifier of the multiple stream identifiers;
   monitoring the multiple data streams by using a control circuit that tracks each of the multiple data streams and associates a single corresponding stream data characteristic of multiple stream data characteristics with each data stream of the multiple data streams so that each data stream of the multiple data streams is associated with a single stream data characteristic of the multiple stream data characteristics;
   accessing, by the control circuit, a stream control table including a plurality of entries, each entry including a corresponding one stream identifier of the multiple stream identifiers, a corresponding one stream data characteristic of the multiple stream data characteristics, and a corresponding one operation condition of a plurality of operation conditions to determine, by the control circuit, a corresponding one operation condition, as a stream operation condition per data stream of the multiple data streams, among the plurality of operation conditions,
   wherein the plurality of operation conditions are determined based on a plurality of operation environments, respectively; and
   depending on a kind of the multiple commands, writing first data of each data stream of the multiple data streams to the non-volatile memory device or reading second data of each data stream of the multiple data streams from the nonvolatile memory device using the corresponding one operation condition, wherein the kind of the multiple commands includes a write command or a read command,
   wherein data of each data stream, associated with a same stream identifier, of the multiple data streams are written to a first same memory block or read from a second same memory block of the nonvolatile memory device, and
   wherein the same stream identifier is stored at the control circuit.

2. The method of claim 1,
   wherein the monitoring of the multiple data streams includes:
   monitoring a data retention characteristic of each data stream of the multiple data streams or a read disturb characteristic of each data stream of the multiple data streams.

3. The method of claim 2, further comprising:
   performing the monitoring of the data retention characteristic of each data stream of the multiple data streams,
   wherein the data retention characteristic of each data stream of the multiple data streams corresponds to a program-read interval time between a program time point when data of a corresponding data stream of the multiple data streams are written to the nonvolatile memory device and a read time point when the data of the corresponding data stream are read from the nonvolatile memory device.

4. The method of claim 2, further comprising:
   performing the monitoring of the data retention characteristic of each data stream of the multiple data streams,
   wherein the monitoring of the data retention characteristic of each data stream of the multiple data streams includes:
   monitoring a number of memory cells in a retention-weak state among a plurality of memory cells of the nonvolatile memory device.

5. The method of claim 2, further comprising:
performing the monitoring of the data retention characteristic of each data stream of the multiple data streams,
wherein the monitoring of the read disturb characteristic includes:
monitoring a read count per data stream of the multiple data streams, and
wherein the read count of each data stream of the multiple data streams indicates a number of times that data corresponding to the each data stream of the multiple data streams is read since the data was written in the nonvolatile memory device.

6. The method of claim 2,
wherein the monitoring of the read disturb characteristic of each data stream of the multiple data streams is performed, and the monitoring of the read disturb characteristic includes:
monitoring a number of memory cells in a read disturb-weak state among a plurality of memory cells of the nonvolatile memory device.

7. The method of claim 1,
wherein the monitoring of the multiple data streams includes:
determining the stream data characteristic of each data stream of the multiple data streams based on access information included in a command associated with a corresponding one of the multiple data streams.

8. The method of claim 1,
wherein the determining of the plurality of operation conditions includes:
determining a plurality of read sequences respectively corresponding to different combinations of a plurality of read operations, the plurality of read operations having different read voltage sets or different read times.

9. The method of claim 8,
wherein the monitoring of the multiple data streams includes:
monitoring the multiple data streams to determine a data retention characteristic of each data stream of the multiple data streams as the stream data characteristic thereof, and
wherein the determining the corresponding one operation condition, as the stream operation condition per data stream of the multiple data streams, of the plurality of operation conditions includes:
selecting a retention read sequence as the stream operation condition among the plurality of read sequences,
wherein in the retention read sequence, a read operation having a read voltage set is performed first in response to the data retention characteristic being determined as degenerated.

10. The method of claim 8,
wherein the monitoring of the multiple data streams includes:
monitoring the multiple data streams to determine a read disturb characteristic of each data stream of the multiple data streams as the stream data characteristic thereof, and
wherein the determining of the corresponding one operation condition, as the stream operation condition per data stream of the multiple data streams, of the plurality of operation conditions includes:
selecting a disturb read sequence as the stream operation condition among the plurality of read sequences, wherein in the disturb read sequence, a read operation having a read voltage set is performed first in response to the read disturb characteristic being determined as degenerated.

11. The method of claim 8,
wherein the monitoring of the multiple data streams includes:
monitoring the multiple data streams to determine a plurality of average read latencies respectively corresponding to the plurality of read sequences with respect to each data stream of the multiple data streams, and
wherein the determining of the corresponding one operation condition, as the stream operation condition per data stream of the multiple data streams, of the plurality of operation conditions includes:
selecting a main read sequence as the stream operation condition among the plurality of read sequences, the main read sequence corresponding to a read sequence having a minimum average read latency among the plurality of average read latencies.

12. The method of claim 8,
wherein the plurality of read sequences includes a first read sequence and a second read sequence,
wherein the first read sequence includes a first read operation having a first read time, and the first read operation is performed first in the first read sequence, and
wherein the second read sequence includes a second read operation having a second read time longer than the first read time, and the second read operation is performed first in the second read sequence.

13. The method of claim 12,
wherein each of the first read operation and the second read operation is a hard decision read operation.

14. The method of claim 12,
wherein the first read operation is a hard decision read operation and the second read operation is a soft decision read operation.

15. The method of claim 1, further comprising:
monitoring degeneration characteristics of memory cells of each memory block of a plurality of memory blocks or each page of a plurality of pages in the nonvolatile memory device, each memory block of the memory blocks corresponding to a unit of an erase operation, each page of the pages corresponding to a unit of a write operation or a read operation,
wherein the determining of the corresponding one operation condition, as the stream operation condition per data stream of the multiple data streams, of the plurality of operation condition:
determining the stream operation condition based on the degeneration characteristics of the memory cells.

16. The method of claim 1,
wherein the determining of the corresponding one operation condition, as the stream operation condition per data stream of the multiple data streams, of the plurality of operation conditions includes at least one of:
determining a plurality of program operation conditions having different program voltages, different program verification voltages or different program times; and
determining a plurality of erase operation conditions having different erase voltages, different erase verification voltages or different erase times.

17. The method of claim 1,
wherein the monitoring of the multiple data streams includes:
monitoring a difference between a program temperature at a time when data of each data stream of the multiple data streams are written in the nonvolatile memory device and a read temperature at a time when the data are read from the nonvolatile memory device.

18. A method of controlling an operation of a nonvolatile memory device that exchanges multiple data streams with a storage controller, each data stream of the multiple data streams being identified with a corresponding one stream identifier of a plurality of stream identifiers, the method comprising:

determining at least one of: a data retention characteristic among a plurality of data retention characteristics and a read disturb characteristic among a plurality of read disturb characteristics of each data stream of the multiple data streams by using a control circuit of the nonvolatile memory device that monitors, for the determining of the data retention characteristic among the plurality of data retention characteristics, at least one of:
  a program-read interval time between a program time point when data are written in the nonvolatile memory device for a corresponding data stream of the multiple data streams and a read time point when the data are read from the nonvolatile memory device for the corresponding data streams of the multiple data streams; and
  a number of memory cells in a retention-weak state among a plurality of memory cells of the nonvolatile memory device, and
monitors, for the determining of the read disturb characteristic among the plurality of read disturb characteristics, at least one of:
  a read count indicating a number of times that data is read since the data was written in the nonvolatile memory device; and
  a number of memory cells in a read disturb-weak state among the plurality of memory cells of the nonvolatile memory device;
accessing, by the control circuit, a stream control table including a plurality of entries, each entry including a corresponding one stream identifier of the plurality of stream identifiers, the at least one of the data retention characteristic and the read disturb characteristic of each data stream of the multiple data streams, and a corresponding read sequence of a plurality of read sequences to determine at least one of a retention read sequence and a disturb read sequence among the plurality of read sequences as a stream operation condition of each data stream of the multiple data streams,
wherein the plurality of read sequences are determined based on a plurality of operation environments, respectively,
wherein each read sequence of the plurality of read sequences is formed of a plurality of read operations different from each other with respect to read voltages sets or read times and has different combinations of the plurality of read operations,
performing, in the retention read sequence, a first read operation at the beginning of the retention read sequence, wherein the first read operation has a read voltage set for the data retention characteristic when the data retention characteristic is determined as degenerated in the determining of the data retention characteristic among the plurality of data retention characteristics; and
performing, in the disturb read sequence, a second read operation at the beginning of the disturb read sequence, wherein the second read operation has a second read voltage set for the read disturb characteristic when the read disturb characteristic is determined as degenerated in the determining of the read disturb characteristic among the plurality of read disturb characteristics.

19. The method of claim 18, further comprising:
monitoring degeneration characteristics of memory cells of the nonvolatile memory device with respect to each memory block of a plurality of memory blocks or each page of a plurality of pages, each memory block of the plurality of memory blocks corresponding to a unit of an erase operation, each page of the plurality of pages corresponding to a unit of a write operation or a unit of a read operation; and
determining operation conditions of the at least one of the retention read sequence and the disturb read sequence among the plurality of the read sequences based on the degeneration characteristics of the memory cells with respect to the each memory block of the plurality of memory blocks or the each page of the plurality of pages.

20. A storage system processing multiple data streams, the storage system comprising:
a nonvolatile memory device comprising a memory cell array in which a plurality of nonvolatile memory cells are arranged; and
a controller including a stream control table,
wherein the stream control table includes a plurality of entries, each entry including a corresponding one stream identifier of a plurality of stream identifiers, a corresponding one stream data characteristics of a plurality of stream data characteristics, and a corresponding one operation condition of a plurality of operation conditions, and
wherein the controller is configured to:
issue a plurality of commands and the multiple data streams, wherein each command of the plurality of commands has a corresponding one stream identifier of the plurality of stream identifiers, and each data stream of the multiple data streams is allocated to a corresponding one stream identifier of the plurality of stream identifiers;
track each of the multiple data streams and associate a single corresponding stream data characteristic of the plurality of stream data characteristics with each data stream of the multiple data streams;
access the stream control table to determine a corresponding one operation condition, as a stream operation per data stream of the multiple data streams, among the plurality of operation conditions, wherein the plurality of operation conditions are determined based on a plurality of operation environments, respectively; and
write data of each data stream of the multiple data streams to the nonvolatile memory device using the determined corresponding one operation condition,
wherein data of each data stream, associated with a same stream identifier, of the multiple data streams are written to a same memory block of the nonvolatile memory device, and
wherein the same stream identifier is stored at the controller.

* * * * *